(12) United States Patent
Pio

(10) Patent No.: US 8,729,523 B2
(45) Date of Patent: May 20, 2014

(54) THREE DIMENSIONAL MEMORY ARRAY ARCHITECTURE

(75) Inventor: Federico Pio, Brugherio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/600,777

(22) Filed: Aug. 31, 2012

(65) Prior Publication Data

US 2014/0061575 A1 Mar. 6, 2014

(51) Int. Cl.
*H01L 29/06* (2006.01)

(52) U.S. Cl.
USPC ............... 257/5; 257/2; 257/4; 257/E21.645; 438/279; 438/421; 438/478

(58) Field of Classification Search
CPC ......... H01L 45/04; H01L 45/06; H01L 45/14; H01L 2924/01322
USPC .......... 438/279, 421, 478; 257/1–5, 209, 314, 257/316, 324, 329, E21.645, E21.573
See application file for complete search history.

(56) References Cited

U.S. PATENT DOCUMENTS

| 6,906,940 | B1 | 6/2005 | Lue |
| 7,943,515 | B2 | 5/2011 | Scheuerlein |
| 7,989,789 | B2 | 8/2011 | Toda |
| 8,173,987 | B2 | 5/2012 | Lung |
| 8,208,279 | B2 | 6/2012 | Lue |
| 2010/0270529 | A1 | 10/2010 | Lung |
| 2010/0270593 | A1 | 10/2010 | Lung et al. |
| 2011/0147690 | A1 | 6/2011 | Yang |

FOREIGN PATENT DOCUMENTS

KR 1020120094339 A 8/2012

OTHER PUBLICATIONS

Related U.S. Appl. No. 13/600,699, entitled, "Three Dimensional Memory Array Architecture," filed Aug. 31, 2012, 55 pages.
Anbarasu et al., "Understanding the Structure and Properties of Phase Change Materials for Data Storage Applications," Journal of the Indian Institute of Science, 91:2, pp. 259-274, Jun. 2011.
International Search Report and Written Opinion of international application No. PCT/US2013/057620, dated Dec. 11, 2013, 10 pp.

*Primary Examiner* — Mark A Laurenzi
(74) *Attorney, Agent, or Firm* — Brooks, Cameron & Huebsch, PLLC

(57) ABSTRACT

Three dimensional memory array architectures and methods of forming the same are provided. An example memory array can include a stack comprising a plurality of first conductive lines at a number of levels separated from one another by at least an insulation material, and at least one conductive extension arranged to extend substantially perpendicular to the plurality of first conductive lines. Storage element material is formed around the at least one conductive extension. Cell select material is formed around the at least one conductive extension. The at least one conductive extension, storage element material, and cell select material are located between co-planar pairs of the plurality of first conductive lines.

32 Claims, 15 Drawing Sheets

THREE DIMENSIONAL MEMORY ARRAY ARCHITECTURE

RELATED APPLICATIONS

The present disclosure is related to U.S. patent application Ser. No. 13/600,777, filed herewith, entitled "THREE DIMENSIONAL MEMORY ARRAY ARCHITECTURE," and is incorporated by reference herein in its entirety.

TECHNICAL FIELD

The present disclosure relates generally to semiconductor devices, and more particularly to three dimensional memory array architectures and methods of forming the same.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistance variable memory, and flash memory, among others. Types of resistance variable memory include phase change material (PCM) memory, programmable conductor memory, and resistive random access memory (RRAM), among others.

Memory devices are utilized as non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices.

Constant challenges related to memory device fabrication are to decrease the size of a memory device, increase the storage density of a memory device, and/or limit memory device cost. Some memory devices include memory cells arranged in a two dimensional array, in which memory cells are all arranged in a same plane. In contrast, various memory devices include memory cells arranged into a three dimensional (3D) array having multiple levels of memory cells.

DETAILED DESCRIPTION

Figure 1:
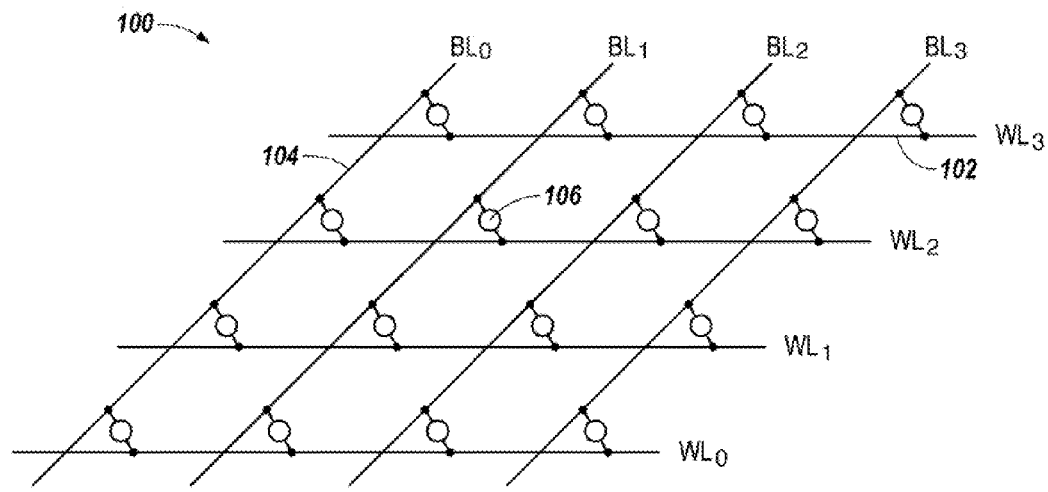
FIG. 1 illustrates a prior art two dimensional memory array.

Three dimensional memory array architectures and methods of forming the same are provided. An example memory array can include a stack comprising a plurality of first conductive lines at a number of levels separated from one another by at least an insulation material, and at least one conductive extension arranged to extend substantially perpendicular to the plurality of first conductive lines. Storage element material is formed around the at least one conductive extension. Cell select material is formed around the at least one conductive extension. The at least one conductive extension, storage element material, and cell select material are located between co-planar pairs of the plurality of first conductive lines.

Embodiments of the present disclosure implement a vertical integration of phase change material (PCM) memory cell. A number of embodiments provide a three dimensional memory array that is denser than a conventional two dimensional memory array. Furthermore, the fabrication processes can be less complex and less expensive than prior approaches, e.g., by reducing a mask count associated with forming a 3D array. Therefore, a number of fabrication processes of the present disclosure can be less expensive than those of previous approaches.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1, and a similar element may be referenced as 202 in FIG. 2. Also, as used herein, "a number of" a particular element and/or feature can refer to one or more of such elements and/or features.

As used herein, the term "substantially" intends that the modified characteristic needs not be absolute, but is close enough so as to achieve the advantages of the characteristic. For example, "substantially parallel" is not limited to absolute parallelism, and can include orientations that are at least closer to a parallel orientation than a perpendicular orientation. Similarly, "substantially orthogonal" is not limited to absolute orthogonalism, and can include orientations that are at least closer to a perpendicular orientation than a parallel orientation.

FIG. 1 illustrates a prior art two dimensional memory array 100. The memory array 100 can include a plurality of conductive lines 102, e.g., access lines, which may be referred to herein as word lines, and a number of conductive lines 104, e.g., data lines, which may be referred to herein as bit lines. The word lines 102 are arranged substantially parallel one another at one level, and the bit lines 104 are arranged substantially parallel one another at a different level. The word lines 102 and bit lines 104 are further arranged substantially perpendicular, e.g., orthogonal, to one another. The indices shown for each word line 102 and bit line 104 indicate the ordering of the respective lines within a particular level.

In such architectures, the memory cells 106 can be arranged in a matrix of rows and columns. The memory cells 106 can be located at the crossings of the word lines 102 and the bit lines 104. That is, the memory cells 106 are arranged in a cross point architecture. The memory cells 106 are located where word lines 102 and the bit lines 104 pass near one another, e.g., cross, overlap, etc. The word lines 102 and the bit lines 104 do not physically intersect one another since the word lines 102 and the bit lines 104 are formed at different levels.

Figure 2:
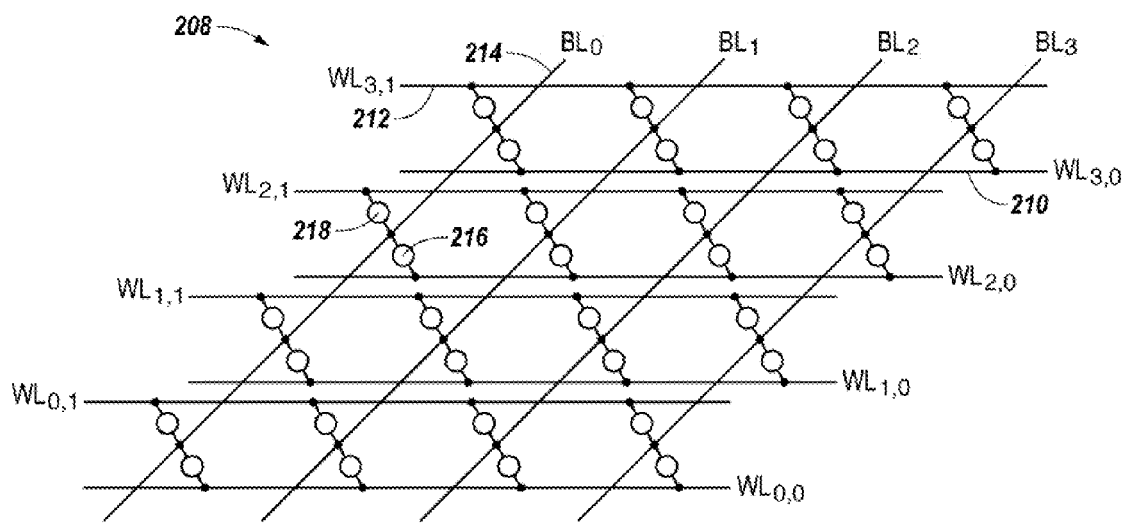
FIG. 2 illustrates a prior art three dimensional memory array.

FIG. 2 illustrates a prior art three dimensional memory array 208. The memory array 208 includes a plurality of word lines 210, 212, and a number of bit lines 214. Word lines 210 are arranged substantially parallel one another at one level and word lines 212 are arranged substantially parallel one another at a different level. As shown in FIG. 2, bit lines 214 are arranged substantially parallel one another at a level different than either of the levels at which word lines 210 and 212 are located, e.g., between the levels at which word lines 210 and 212 are located. The bit lines 214 are further arranged substantially perpendicular, e.g., orthogonal, to word lines 210, 212.

Memory cells 216, 218 are shown in FIG. 2 arranged in a cross point architecture at the crossings of the word lines 210, 212 and the bit lines 214. Memory cells 216 are arranged between word lines 210 and bit lines 214, and memory cells 218 are arranged between word lines 212 and bit lines 214. As such, the memory cells are arranged in multiple levels, each level having memory cells organized in a cross point architecture. The levels are formed at different levels from one another, thereby being vertically stacked. Memory cells are formed at levels between levels at which word lines 212 and bit lines 214 are formed. The three dimensional memory array 208 shown in FIG. 2 includes memory cells 216, 218 having a common a bit line 214, but separate word lines 210, 212. More generally, a three dimensional memory array may have more stacked levels than shown in FIG. 2.

The indices shown for each word line 210, 212 indicate the level and the ordering of the word lines within a particular level. For example, word line 210 ($WL_{3,0}$) is shown being located at position 3 within level 0, and word line 212 ($WL_{3,1}$) is shown being located at position 3 within level 1. As such, memory cell 216 is shown in FIG. 2 being located between bit line 214, e.g., $BL_0$, and the word line below bit line 214, e.g., $WL_{2,0}$, and memory cell 218 is shown in FIG. 2 being located between bit line 214, e.g., $BL_0$, and the word line above bit line 214, e.g., $WL_{2,1}$.

Figure 3:
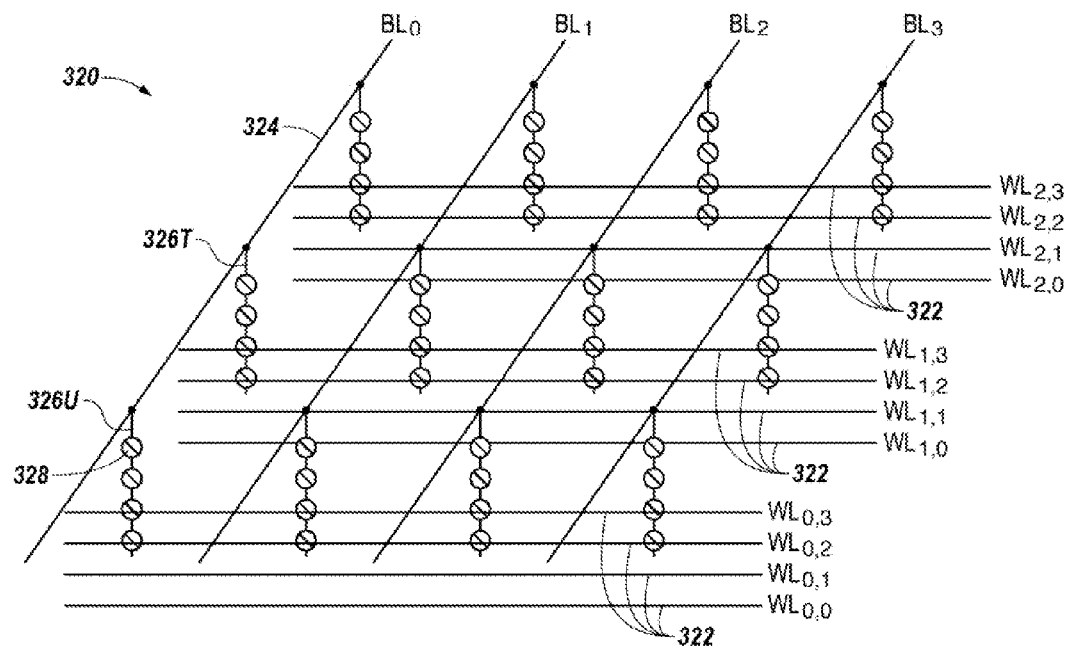
FIG. 3 illustrates a three dimensional memory array in accordance with a number of embodiments of the present disclosure.

FIG. 3 illustrates a three dimensional memory array 320 in accordance with a number of embodiments of the present disclosure. Memory array 320 comprises a plurality of memory cells, e.g., memory element in series with a cell select device, between a first terminal, e.g., a bit line, and a second terminal, e.g., a word line, each of the terminals being independently addressable in read/program/erase operations.

FIG. 3 is a simplified diagram that does not precisely reflect the three dimensional physical dimensions of the various features illustrated, including the exact proximity of features to one another. FIG. 3 should not be considered as to be representative of the precise topological positioning of the various elements. Rather, FIG. 3 provides a simplified overview of the electrical scheme of memory array 320, and approximate relative arrangement of the various features. For example the bit lines 324 may be located at the top (as shown) and/or bottom of the array, electrically decoupled from one another. Also, conductive extensions 326T and 326U coupled to the same bit line 324 are all biased to the same bit line potential. However, FIG. 3 doesn't show the physical proximity of memory cell structures 328 to word lines at a particular level, e.g., $WL_{3,2}$ and $WL_{1,2}$. FIGS. 5A-10B illustrate in more detail aspects of a three dimensional memory array in accordance with a number of embodiments of the present disclosure. As will become apparent from the discussion that follows, in several embodiments a memory cell structure 328 can have portions associated with multiple memory cells. For example, each memory cell structure 328 can have two portions, one portion associated with one adjacent word line 322 and another portion associated with another adjacent word line 322. Also, for the configuration shown in FIG. 3, a memory cell can be comprised of portions of two memory cell structures 328, one portion on a memory cell structure 328 formed between conductive extension 326T and a particular word line, and another portion on a different memory cell structure 328 formed between conductive extension 326U and the particular word line. Memory cell structures 328 can be physically present at locations where a respective conductive extension, e.g., 326T, 326U, passes in proximity between pairs of adjacent word lines 322 at each particular level.

In a number of embodiments, access lines, which may be referred to as word lines (WLs), are disposed on a plurality of different levels, e.g., elevations, decks, planes. For example, word lines can be disposed on N levels. Insulation material, e.g., dielectric material, separates the levels of word lines. As such, the levels of word lines separated by insulation material form a stack of WL/insulation materials. Data lines, which may be referred to as bit lines (BLs), are arranged substantially perpendicular to the word lines, and located at a level above the N levels of word lines, e.g., at the N+1 level. Each bit line can have a number of conductive extensions, e.g., vertical extensions, in proximity to the word lines, such as between the word lines, with a memory cell formed between the vertical extension and the word line.

The memory array 320 shown in FIG. 3 can include a plurality of word lines 322 and bit lines 324. Word lines 322 can be arranged into a number of levels. Word lines 322 are shown being arranged into four levels in FIG. 3. However, the quantity of levels into which the word lines 322 can be arranged are not limited to this quantity, and word line 322 can be arranged into more, or fewer, levels. Word lines 322 are arranged substantially parallel one another within a particular level. The word lines 322 can be aligned vertically in a stack. That is, word lines 322 in each of the multiple levels can be located at a same relative location within each level so as to be aligned with word lines 322 directly above and/or below. Insulation material (not shown in FIG. 3) can be located between the levels at which word lines 322 are formed and between word lines 322 at a particular level.

As shown in FIG. 3, bit lines 324 can be arranged substantially parallel one another at a level different than the levels at which word lines 322 are located, e.g., above and/or below the levels at which word lines 322 are located. That is, the bit lines can be located at the top of the memory array 320, for instance. The bit lines 324 can be further arranged substantially perpendicular, e.g., orthogonal, to word lines 322 so as to have overlappings, e.g., crossings at different levels, therebetween. However, embodiments are not limited to a strictly parallel/orthogonal configuration. Also, although FIG. 3 shows the bit lines 324 being formed over the word line 322, embodiments of the present disclosure are not so limited, and according to some embodiments the bit lines can be formed below the word lines 322 with the conductive extension extending up from the bit lines to be in proximity with the word lines 322. According to some embodiments bit lines can be formed below the word lines 322 with the conductive extension extending up from the bit lines to be in proximity with the word lines 322, and bit lines can also be formed above the word lines 322 with the conductive extension extending down from the bit lines to be in proximity with the word lines 322.

The indices shown for each word line 322 in FIG. 3 indicate the position, e.g., ordering, of the word lines within a particular level and the level. For example, word line $WL_{2,0}$ is shown being located at position 2 within level 0 (a word line at the bottom of a stack of word lines located at position 2), and word line $WL_{2,3}$ is shown being located at position 2 within level 3 (a word line at the top of a stack of word lines located at position 2). The quantity of levels into which the word lines 322 can be arranged, and the quantity of word lines 322 at each level can be more, or fewer, than the quantities shown in FIG. 3.

Between each overlapping of a bit line 324 and a stack of word lines 322, a conductive extension 326T of the bit line 324 can be oriented substantially perpendicular to the bit line 324 and the word lines 322, so as to pass proximal to, e.g., near, a portion of each word line 322 in the stack of word lines. According to some embodiments, the conductive extension 326T of the bit line 324 can pass between two stacks of word lines so as to pass proximal, e.g., adjacent, to each word line in each of the two stacks of word lines.

For example, the conductive extension 326T of the bit line 324 can be arranged to extend vertically from the bit line 324 to pass proximal to a portion the respective word lines 322 therebelow, as shown in FIG. 3. As shown, the conductive extension 326T can pass between two word lines 322 at each level, so as to be proximal, e.g., adjacent, to each of the two word lines 322. For example, conductive extension 326T illustrated in FIG. 3 passes between word lines identified as $WL_{1,j}$ and $WL_{2,j}$ so as to be proximal, to each at the level at which $WL_{1,j}$ and $WL_{2,j}$ are formed. Adjacent, as used here, does not always intend so close as to be touching, but rather close enough that other materials disposed between the conductive extension and word line, e.g., to form a memory cell therebetween, are electrically in series. According to a number of embodiments, the conductive extension 326T can pass near the two word lines 322, e.g., adjacent, in such a manner that a memory cell can be formed between the conductive extension 326T and each respective word line 322.

Memory cell structures 328 are shown in FIG. 3 arranged in a cross point architecture near the location of where a conductive extension 326T/326U of a bit line 324 and the word lines 322 are in proximity to one another, e.g., overlap, at different levels. In a number of embodiments, the memory cell structures 328 are located between the conductive extension 326T/326U and the word lines 322 (identified as $WL_{1,j}$ and $WL_{2,j}$). For example, where a conductive extension 326T/326U passes proximal to a word line 322, a memory cell structure 328 can be located between the conductive extension 326T/326U and the word line 322. Each memory cell structure 328 can have portions associated with two different memory cells, and each memory cell can be comprised of portions of two different memory cell structures, e.g., a portion of each memory cell structure 328 adjacent each side of a particular word line.

Conductive extension 326U identifies a different conductive extension of bit line $BL_0$, e.g., different from conductive extension 326T. Conductive extension 326T and 326U are both communicatively coupled to the same bit line, and therefore, are biased to the same potential. In some embodiments, conductive extensions 326T and 326U are located between stacks of word lines 322 so as to be respectively located at different, e.g., opposite, sides of the same stack of word lines, e.g., $WL_{1,j}$ as depicted in FIG. 3. That is, a particular conductive extension is located in proximity to two word lines 322 on each plane of the stack, e.g., the vertical extension 326T is located proximally to a pair of word lines 322 identified as $WL_{1,j}$ and $WL_{2,j}$.

A memory cell structure can be located between a conductive extension, e.g., 326T/326U, and the adjacent word lines 322 at each level in the stack of word lines. As is described in more detail later, a memory cell structure 328 can be associated with one or more memory cells. The memory cell structures 328 shown in FIG. 3 (and other figures that follow) are shown with a diagonal line through the circular symbol to indicate multiple memory cells associated with one memory cell structure 328. For example, in FIG. 3 one portion of a memory cell structure 328 between a particular conductive extension and one of the word lines between which the particular conductive extension is adjacent at a given level can be associated with one memory cell, and another portion of the same memory cell structure 328 between the particular conductive extension and another one of the word lines between which the particular conductive extension is adjacent at the given level can be associated with another memory cell.

In other embodiments, not represented in FIG. 3, at any given level, e.g., level j, in the plurality of levels, conductive extension 326T can be located to pass by one side of a first word line, e.g., $WL_{1,j}$, and conductive extension 326U can be located to pass by the opposite side of the first word line. Conductive extension 326T can also be located to pass by one side of a word line adjacent to, and co-planar with, the first word line, e.g., $WL_{2,j}$. The conductive extensions 326T and 326U can be accessed through respective bit lines and each word line can be independently accessed. In this manner, the two conductive extensions 326T and 326U can be located proximally to a particular word line 322, with conductive extension 326T being a first terminal of a respective first memory cell, e.g., a portion of a first memory cell structure 328, and the first word line 322, e.g., $WL_{1,j}$, being a second terminal of the respective first memory cell. At the same time, conductive extension 326T can be located proximally to a second word line 322, e.g., $WL_{2,j}$, adjacent to the particular word line 322, with conductive extension 326T being a first terminal of a respective second memory cell, e.g., a portion of a first memory cell structure 328, and the second word line 322, e.g., $WL_{2,j}$, being a second terminal of the respective second memory cell. In this manner two memory cells can be formed, e.g., at sides of a memory cell structure 328 formed around the conductive extensions at any given level, such as is shown below with respect to FIGS. 5D and/or 5E. In some embodiments, conductive extension 326T (shown in FIG. 3), and corresponding memory cell structures 328, can be located between alternate word lines, such as the arrangement shown in FIGS. 5B and/or 5C.

As such, the memory cell structures 328, and memory cells comprised of portions of the memory cell structures 328, can be arranged in multiple levels, each level having memory cell structures 328 (and memory cells) organized in a cross point architecture. The levels of memory cell structures 328 can be formed at different levels from one another, thereby being vertically stacked. The three dimensional memory array 320 shown in FIG. 3 can include memory cell structures 328 having a common bit line 324, but different word lines 322. Although four levels of word lines 322 (and four corresponding levels of memory cell structures 328) are shown in FIG. 3, embodiments of the present disclosure are not so limited and can include more, or fewer, levels of word lines 322 (and corresponding levels of memory cell structures 328). Memory cell structures (and memory cells) may be formed substantially at the same levels as word lines are formed.

According to a number of embodiments of the present disclosure, the memory cells of the memory cell structures 328 can be a resistance variable memory cell. For example, a memory cell of the memory cell structures 328 can include a phase change material (PCM), e.g., chalcogenide. Each memory cell of the memory cell structures 328 can also include a switch, e.g., a MOS transistor, a BJT, a diode, an ovonic threshold switch (OTS), among other types of switches. An OTS can comprise chalcogenide material, such as a chalcogenide material different than that used for the memory element.

According to embodiments, a memory cell of the memory cell structure 328 can include a storage element connected in series with a respective cell select device, e.g., cell access device, each formed concentrically around the conductive extension 326T/326U as explained in further detail with respect to FIGS. 5A-5D below. Within this disclosure, "concentric" refers to structures substantially surrounding each other, and is not limited to exactly or quasi-exactly circular shapes or footprints, e.g., oval, square, or rectangular concentric memory cells may be formed. A number of embodiments include a three dimensional memory array of phase change material (PCM) and switch memory cells, which can be referred to as a 3D PCMS array. For simplicity, FIG. 3 shows a memory cell structure 328 located between an extension 326T and a word line 322, such as where extension 326T and word line 322 are nearest one another. A same word line 322 can be proximal to multiple conductive extensions of bit lines 326T/326U, and thus have many memory cell structures 328 (and memory cells) formed between the word line 322 and different bit lines as will be clear from the descriptions of FIG. 5A-10C.

Figure 4:
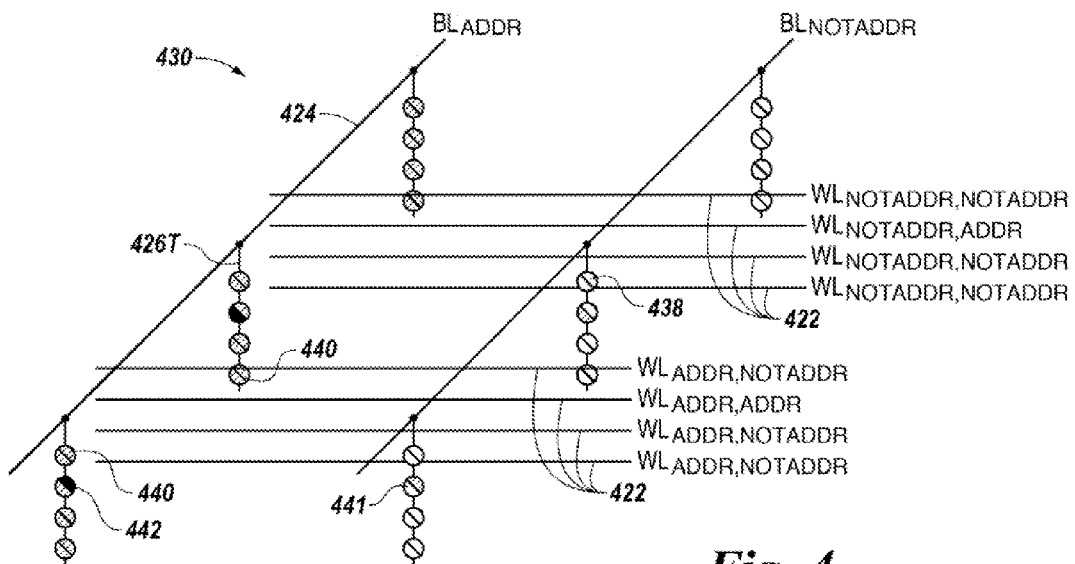
FIG. 4 illustrates a method for biasing of a three dimensional memory array in accordance with a number of embodiments of the present disclosure.

FIG. 4 illustrates a method for biasing of a three dimensional memory array in accordance with a number of embodiments of the present disclosure. FIG. 4 is a simplified diagram does not reflect the physical dimensions of the various features illustrated, including the actual proximity of features to one another. Rather, FIG. 4 provides an electrical scheme and a simplified overview of the relative arrangement of the various features with respect to the operations discussion that follows. FIGS. 5A-10B illustrate in more detail aspects of a three dimensional memory array in accordance with a number of embodiments of the present disclosure. FIG. 4 shows a memory array 430, which can be a portion of memory array 320 described with respect to FIG. 3. The memory array 430 can include a plurality of word lines 422, orthogonally-oriented bit lines 424, and conductive extensions 426T coupled to and arranged to extend vertically down from the bit lines 424, perpendicular to both the word lines 422 and bit lines 424.

To access, e.g., program or read, memory array 430, a balanced biasing scheme is adopted. The addressed word line 422, e.g., word lines at the addressed position on the addressed level, and the addressed bit line are biased so that the voltage difference across them exceeds the threshold voltage of the respective cell select device. Unaddressed word lines 422 and unaddressed bit lines 424 are biased so that the voltage difference across any other pair of addressed and/or unaddressed word lines 422 and bit lines 424, does not exceed the threshold voltage of the respective cell select device. For example, all other word lines 422 (including different word lines 422 located in a same level and word lines 422 located at different levels) and other bit lines 424 can be biased at an intermediate voltage, e.g., a reference voltage ($V_{REF}$) such as a mid-point voltage between addressed bit line and word line voltages.

The addressed bit line 424 is shown in FIG. 4 as $BL_{ADDR}$, and the unaddressed bit line 424 is shown as $BL_{NOTADDR}$. The indices shown for each word line 422 in FIG. 4 correspond to the position of the word lines within a particular level and the level. The word lines 422 shown in FIG. 4 are annotated with ADDR for an addressed level or position within a level, and NOTADDR for an unaddressed level or different word line position within a level. Therefore, the addressed word line 422 is shown in FIG. 4 as $WL_{ADDR, ADDR}$. Unaddressed word lines 422 shown in FIG. 4 as one of $WL_{NOTADDR, NOTADDR}$, $WL_{NOTADDR, ADDR}$, or $WL_{ADDR, NOTADDR}$, to indicate that the unaddressed word line 422 is located at a position and/or a level that is not addressed.

According to a number of embodiments, the unaddressed word lines 422 and unaddressed bit lines 424 can be biased to an intermediate voltage to reduce the maximum voltage drop with respect to either the addressed word line 422 or the addressed bit line 424. For example, the intermediate voltage can be chosen to be at a mid-point between the addressed word lines 422 and addressed bit lines. However, the intermediate voltage can be selected to be different than a mid-point voltage to minimize the disturb on memory cells on the word lines 422 and/or on the bit lines 424.

FIG. 4 shows memory cell structure 442 having the portion (associated with one memory cell) between the addressed word line 422 and the addressed bit line 424 solidly shaded to indicate the voltage difference across memory cell 442 exceeding the threshold voltage, V, of the associated cell select device. The other portion of memory cell structure 442 (associated with a different memory cell) between an unaddressed word line 422 and the addressed bit line 424 partially shaded to indicate that portion of memory cell structure 442 being disturbed, but with the voltage difference across that portion of memory cell structure 442 not exceeding the threshold voltage, V, of the associated cell select device. FIG.

4 also shows portions of undisturbed memory cell structures 438, between unaddressed word lines 422 and unaddressed bit lines 424 without any shading to indicate the voltage difference across memory cell 438 is insignificant, e.g., null, zero. FIG. 4 also shows disturbed portions of memory cell structures 440 between unaddressed word lines 422 and the addressed bit line 424, and disturbed portion of memory cell structure 441 between the addressed word line 422 and the unaddressed bit lines 424, as being partially shaded to indicate the voltage difference there across is some intermediate voltage that is less than the threshold voltage of the respective cell select device, e.g., V/2. It can be beneficial to bias unaddressed word lines 422 and unaddressed bit lines 424 to a same voltage.

FIG. 4 represents the effective electrical scheme of a memory array 430 according to a number of embodiments. However, FIG. 4 should not be considered as to be representative of the topological positioning of the various elements, e.g., $BL_{ADDR}$ and $BL_{NOTADDR}$ may physically be located such that one is formed at the top of the array and one is formed at the bottom of the array. Also, $BL_{ADDR}$ and $BL_{NOTADDR}$ indicate that these bit lines 424 are not addressed bit lines at any same given time. All conductive extensions, e.g., 426T, coupled to a same bit line 424 are biased to the same potential (as the respective bit line 424). Disclosed read/program/erase conditions are applied to corresponding, e.g., addressed or not addressed, conductive lines, e.g., bit lines and/or word lines.

The memory array structure has some similarities to three dimensional vertical channel NAND memories. However, accessing a memory cell, e.g., a resistance variable memory cell, involves passing current (which also flows in the addressed bit line 424, e.g., $BL_{ADDR}$, and/or addressed word line 422, e.g., $WL_{ADDR, ADDR}$) through the portions of two memory cell structures associated with a memory cell on each side of the addressed word line. The balanced biasing scheme of the present disclosure allows a voltage drop above a threshold to be obtained only on an addressed cell, e.g., on addressed word line, and bit line, while only disturbing cells along the addressed word line and bit line, at not-addressed bit lines and word lines, respectively, e.g., at most a minimum leakage current flows through the not addressed cells.

Figure 5A:
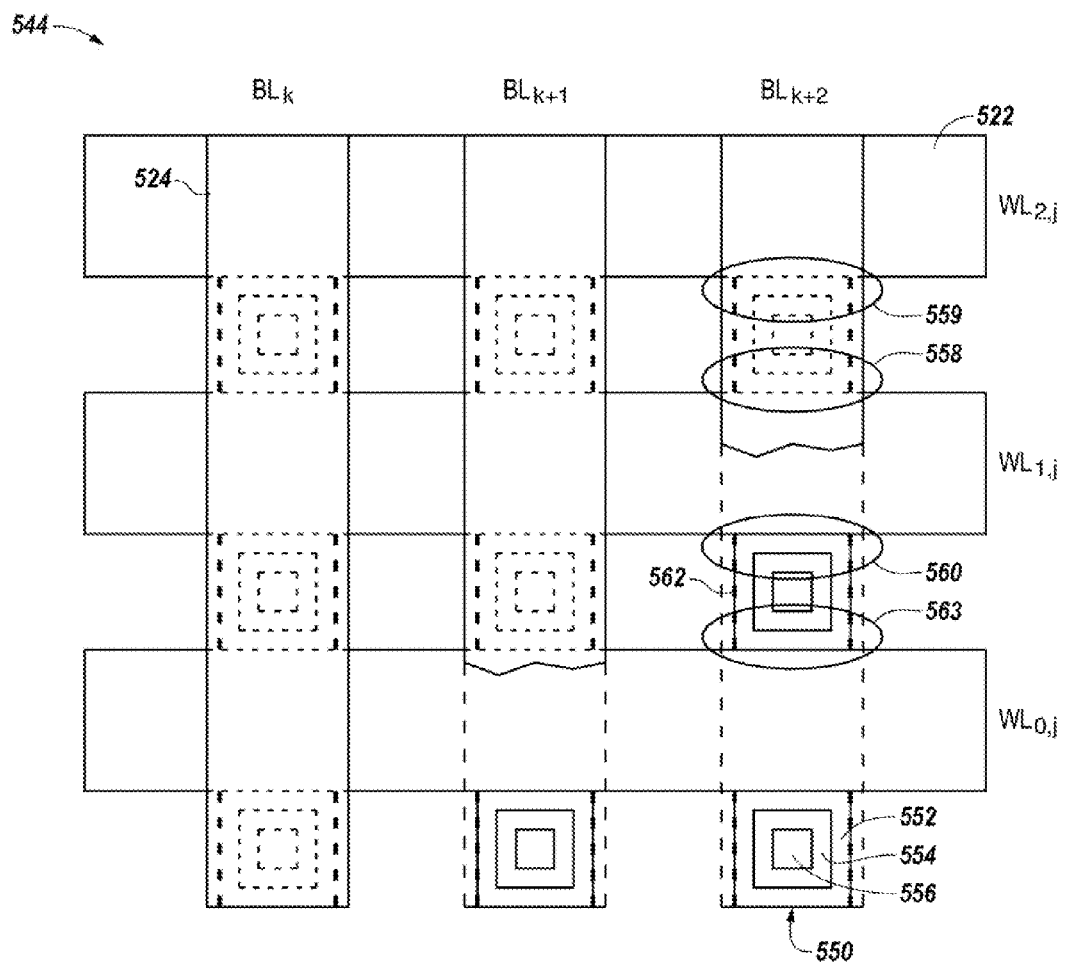
FIG. 5A illustrates location of concentric memory cell structures between pairs of conductive lines in accordance with a number of embodiments of the present disclosure.

FIG. 5A illustrates location of concentric memory cell structures 550 between pairs of conductive lines in accordance with a number of embodiments of the present disclosure. For each of the embodiments described with respect to FIG. 5A-5E, memory cells can be formed at levels at which word lines are formed. A respective three dimensional memory array may have more word lines in a given level, more word lines at additional levels, more bit lines, and more concentric memory cell structures than are shown in example in FIG. 5A-5E. Memory cells may be formed substantially at the same levels as conductive lines, e.g., word lines, are formed, such that a concentric memory cell is substantially co-planar with the conductive line. One memory cell can be formed in proximity of each word line-bit line overlap.

FIG. 5A shows a top view of a portion of a memory array 544, such as memory array 320 illustrated in FIG. 3. The memory array 544 includes a plurality of first conductive lines 522, e.g., word lines, and a plurality of second conductive lines 524, e.g., bit lines, arranged perpendicular to the first conductive lines 522. The first conductive lines 522 and second conductive lines 524 overlap and thereby form a grid of conductive lines.

FIG. 5A illustrates formation of concentric memory cell structures 550 that utilizes masking that can accommodate some variation in terms of mask dimension and mask alignment. According to a number of embodiments, a stack can be formed comprising conductive material (used to form a plurality of conductive lines 522, e.g., word lines) at a number of levels separated from one another by at least an insulation material, e.g., dielectric material, between the conductive materials. For example, the stack of alternating conductive and insulation materials can be formed, e.g., deposited, as is shown and discussed further with respect to FIGS. 7 and 8A-8D.

The stack of alternating conductive and insulation materials can be patterned to form the conductive lines 522, filling the volume between the conductive lines 522 with additional insulation material. Thereafter, a number of openings can be made in a stripe pattern the direction shown in FIG. 5A of conductive lines 524 to form self-aligned vias 562, e.g., self-aligned to the conductive lines 522. The self-aligned vias 562 are defined by a trench, which can be formed by a trench mask and etch, for self-aligned vias in one direction, e.g., a horizontal direction in FIG. 5A, and by conductive lines 522 in another direction, e.g., a vertical direction in FIG. 5A, such that the self-aligned vias 562 are aligned, e.g., self-aligned, to conductive lines 522. A trench mask can be specific to each self-aligned via 562, extending a distance over word lines that bound the self-aligned vias 562 on two sides, for example. In some embodiments, self-aligned vias are not formed between all word lines, which can be excluded by not forming a trench mask opening thereover. The self-aligned vias 562 are formed prior to forming the conductive lines 524. The self-aligned vias 562 accommodate concentric memory cell structure 550, and therefore are coincident with concentric memory cell structure 550. As shown in FIG. 5A, the self-aligned vias 562 are formed adjacent to and masked by the conductive lines 522, as well as a trench, e.g., left/right walls formed between the conductive lines 522.

Cell select device material 552 and storage element material 554 can be formed, e.g., conformal deposited, in the self-aligned vias 562 so as to deposit a uniform thickness on the sidewalls of the self-aligned vias 562. For example, the cell select device material 552 can be an ovonic threshold switch (OTS) material, and the storage element material 554 can be a phase change material (PCM). A conductive material, e.g., metallic material, forming a conductive extension 556 can also be deposited in the self-aligned vias 562, e.g., to complete filling of the self-aligned vias 562. In this manner, the conductive extension 556 is arranged to extend substantially perpendicular to the plurality of conductive lines 522. The conductive extension 556 is substantially orthogonal to conductive lines 522 and 524, e.g., it extends through the page.

FIG. 5A shows the storage element material 554 and cell select device material 552 concentrically arranged around the conductive extension 556. As used herein, concentric does not necessarily mean circular. Because the self-aligned vias 562 are formed as a trench between substantially perpendicular conductive lines 522, and the cell select device material 552 and storage element material 554 are deposited on the walls of the self-aligned vias 562, the cell select device material 552, storage element material 554, and conductive extension 556 can be concentric polygon-shaped, e.g., square, rectangle, etc., volumes, as shown in FIG. 5A. According to alternative embodiments, the concentric memory cell structures 550 can be formed in substantially circular vias in place of the self-aligned vias 562.

Although FIG. 5A shows that the storage element material 554 is arranged adjacent to the conductive extension 556, and the cell select device material 552 is arranged concentric to the storage element material 554, embodiments of the present disclosure are not so limited. According to a number of embodiments, the cell select device material 552 can be arranged adjacent to the conductive extension 556, and the storage element material 554 can be arranged concentric to the cell select device material 552.

The storage element material 554 can be a resistance variable storage material, such that the storage element is a resistance variable storage element. The resistance variable storage element may include a PCM, for instance, among other resistance variable storage element materials. In embodiments in which the resistance variable storage element comprises a PCM, the phase change material can be a chalcogenide alloy such as an indium(In)-antimony(Sb)-tellurium (Te) (IST) material, e.g., $In_2Sb_2Te_5$, $In_1Sb_2Te_4$, $In_1Sb_4Te_7$, etc., or a germanium(Ge)-antimony(Sb)-tellurium(Te) (GST) material, e.g., $Ge_8Sb_5Te_8$, $Ge_2Sb_2Te_5$, $Ge_1Sb_2Te_4$, $Ge_1Sb_4Te_7$, $Ge_4Sb_4Te_7$, or etc., among other phase change materials. The hyphenated chemical composition notation, as used herein, indicates the elements included in a particular mixture or compound, and is intended to represent all stoichiometries involving the indicated elements. Other phase change materials can include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. Other examples of resistance variable materials include transition metal oxide materials or alloys including two or more metals, e.g., transition metals, alkaline earth metals, and/or rare earth metals. Embodiments are not limited to a particular resistive variable material or materials associated with the storage elements of the memory cells. For instance, other examples of resistive variable materials that can be used to form storage elements include binary metal oxide materials, colossal magnetoresistive materials, and/or various polymer based resistance variable materials, among others.

The memory cells comprising a cell select device in series with a phase change material, can be referred to as phase change material and switch (PCMS) memory cells. In a number of embodiments, the concentrically arranged cell select device functions as a two-terminal OTS, for instance. The OTS material can include, for example, a chalcogenide material that is responsive to an applied voltage across the OTS. For an applied voltage that is less than a threshold voltage, the OTS remains in an "off" state, e.g., an electrically nonconductive state. Alternatively, responsive to an applied voltage across the OTS that is greater than the threshold voltage, the OTS enters an "on" state, e.g., an electrically conductive state. Responsive to an applied voltage near a threshold voltage, the voltage across the OTS may "snapback" to a holding voltage.

In a number of embodiments, the concentrically-formed storage element can function as a two-terminal phase change storage element. However, embodiments of the present disclosure are not limited to PCMS cross-point arrays or a particular cell select switch. For instance, the methods and apparatuses of the present disclosure can be applied to other cross-point arrays such as arrays utilizing resistive random access memory (RRAM) cells, conductive bridging random access memory (CBRAM) cells, and/or spin transfer torque random access memory (STT-RAM) cells, among other types of memory cells, for example.

In a number of embodiments, the storage element material 554 can comprise one or more of the same material(s) as the cell select device material 552. However, embodiments are not so limited. For example, the storage element material 554 and the cell select device material 552 can comprise different materials.

The materials described herein may be formed by various thin film techniques including, but not limited to, spin coating, blanket coating, chemical vapor deposition (CVD) such as low pressure CVD, plasma enhanced chemical vapor deposition (PECVD), atomic layer deposition (ALD), plasma enhanced ALD, physical vapor deposition (PVD), thermal decomposition, and/or thermal growth, among others. Alternatively, materials may be grown in situ. While the materials described and illustrated herein may be formed as layers, the materials are not limited thereto and may be formed in other three-dimensional configurations. Fabrication techniques are discussed further with respect to FIGS. 7 and 8A-8D.

Although not shown in FIG. 5A for clarity, additional materials may be concentrically formed between the conductive extension 556 and a respective conductive line 522, such as a heater material. Another example is a material formed between the storage element material 554 and the cell select device material 552 to separate and/or provide protection between the storage element material 554 and the cell select device material 552, to mitigate composition mixing, for instance. In still another example, additional material(s) may be used as adhesion layer to improve adhesion of cell select device material and/or storage element material to underlying materials.

After formation of the memory cell structures 550 in self-aligned vias 562, conductive lines 524, e.g., bit lines, can be formed over the memory cell structures 550 and conductive lines 522. Conductive lines 524 can be formed substantially perpendicular to conductive lines 522 (as shown in FIG. 5A), and substantially perpendicular to conductive extensions 556 (which are directed into and out of the plane of FIG. 5A). The conductive extension 556 can be communicatively coupled at one end to a conductive line 524, as was shown and discussed, for example, with respect to FIG. 3, and further detailed below. Each memory cell, e.g., 558 and 560, associated with a particular conductive line 522, e.g., $WL_{1,j}$, is accessed by a pair of conductive extensions 556 at both sides of the addressed conductive line 522. Also, each of such conductive extensions 556 is used to address (a portion of) a different memory cell structure 550 on an adjacent conductive line 522. It is however noted that since all conductive extensions 556 coupled to a same conductive line 524, e.g., bit line, are biased to the same voltage, e.g., a particular conductive line 524 and conductive extensions 556 coupled thereto are effectively the same electrical node despite topological differences. Conductive lines 524 overlap, but do not intersect, conductive lines 522. For example, conductive lines 524 can be formed at a different level than conductive lines 522, with insulation material formed therebetween for isolation of the respective conductive lines 522 and 524.

A concentric memory cell structure 550, including a storage element portion connected in series with a respective cell select device portion, is formed between a conductive extension 556 and a conductive line 522. The conductive extension 556, storage element material 554, and cell select device material 552 of a respective memory cell structure 550 pass in proximity to a respective conductive line 522, e.g., between pairs of conductive lines 522. According to the embodiment illustrated in FIG. 5A, a memory cell structure 550 is located in between each pair of adjacent conductive lines 522 along a conductive line 524.

As such, each self-aligned via 562 is in contact with two adjacent conductive lines 522, and each conductive line 522 is in contact with two self-aligned vias 562 (corresponding to each conductive line 524, such that two active regions, e.g., volumes subject to phase change, are associated with each overlap of a conductive line 522 and a conductive line 524. For example, one example memory cell located between $WL_{1,j}$ and $BL_{k+2}$ is shown in FIG. 5A comprising portion 558 of a first memory cell structure 550, and portion 560 of a second memory cell structure 550. These portions 558 and 560 of different memory cell structures 550 are involved when programming or reading information stored between $WL_{1,j}$ and $BL_{4+2}$. The portion 559 of the first memory cell structure 550 opposite portion 558 comprises part of a memory cell located between $WL_{2,j}$ and $BL_{k+2}$, and the portion 563 of the second memory cell structure 550 opposite portion 560 comprises part of a memory cell located between $WL_{0,j}$ and $BL_{k+2}$.

Therefore, according to a number of embodiments of the present disclosure, a memory cell, which is used to store one unit of information, e.g., a bit, comprises two active regions, each a portion of two different memory cell structures 550. As depicted in FIGS. 3 and 4, each memory cell, e.g., comprising 558 and 560, can be unambiguously addressed by addressing one conductive line 522, e.g., one word line, and one conductive line 524, e.g., one bit line, independent of the specific topology that may differ in the different embodiments shown in different figures. Where the portions of the two memory cell structures 550 comprising a memory cell are less than one-half of the entire volume of a memory cell structure 550, the active volume associated with a memory cell can be reduced with respect to the full volume of one memory cell structure 550. Other embodiments can reduce the active volume associated with a memory cell even further, as discussed below.

Figure 5B:
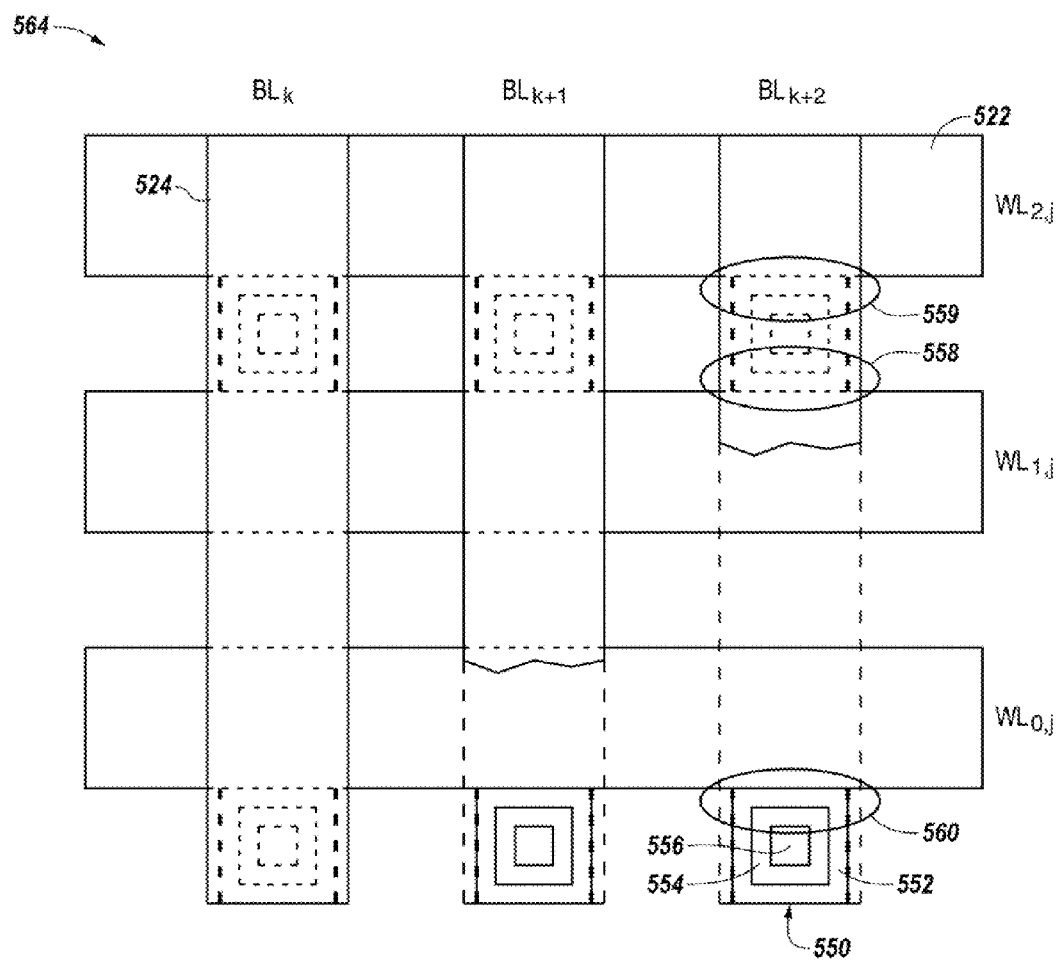
FIG. 5B illustrates location of concentric memory cell structures between alternate pairs of conductive lines in accordance with a number of embodiments of the present disclosure.

FIG. 5B illustrates location of concentric memory cell structures 550 between alternate pairs of conductive lines 522 in accordance with a number of embodiments of the present disclosure. By alternating location of the self-aligned vias, along a particular bit line, to between every other word line, only one side of each memory cell structure is active with respect to a particular pair of word line and bit line. That is, only approximately one half of the possible self-aligned vias are formed along a particular bit line (there may be one more than half for some arrangements). In this manner, the total volume of active region subject to phase change with respect to a particular memory cell is reduced for the configuration shown in FIG. 5B with respect to the configuration shown in FIG. 5A.

The composition and configuration of a memory cell structure 550' can be the same as was described with respect to FIG. 5A, and the process for forming a particular memory cell structure 550 can be the same as described with respect to array 544 shown in FIG. 5A. The arrangement of conductive lines 522 and 524 for array 564 can be the same as was described with respect to FIG. 5A. However, the locations of memory cell structures 550 for array 564 shown in FIG. 5B are different than that for array 544 shown in FIG. 5A.

Conductive lines 524 are formed over conductive lines 522, as shown in FIG. 5B. As such, conductive extensions 556 extend vertically down from conductive lines 524 to pass in proximity to, e.g., between, conductive lines 522, similar to the configuration shown with respect to FIG. 3. The conductive extension 556 is substantially orthogonal to conductive lines 522 and 524, e.g., it extends through the page.

FIG. 5B shows concentric memory cell structures 550 between alternate pairs of conductive lines 522 such that each self-aligned via is in contact with two adjacent conductive lines 522, but that each conductive line 522 is in contact with one self-aligned via (corresponding to each conductive line 524). As such, one active region, e.g., 558, 560, of one memory cell structure 550 is associated with each overlap of a conductive line 522 and a conductive line 524. Therefore, each memory cell comprises one active region 558/560 of one memory cell structure 550, involving approximately one-half the active volume per memory cell than that described with respect to FIG. 5A.

For example, one example memory cell located between $WL_{1,j}$ and $BL_{k+2}$ is shown in FIG. 5B comprising portion 558 of a first memory cell structure 550. The portion 559 of the first memory cell structure 550 opposite portion 558 comprises another memory cell located between $WL_{2,j}$ and $BL_{k+2}$. Yet another memory cell, located between $WL_{0,j}$ and $BL_{k+2}$ is shown in FIG. 5B comprising portion 560 of a second memory cell structure 550. As depicted in FIGS. 3 and 4, each memory cell can be a portion, e.g., 558, of a memory cell structure 550 can be unambiguously addressed by addressing one conductive line 522, e.g., one word line, and one conductive line 524, e.g., one bit line, independent of the specific topology that may differ in the different embodiments shown in different figures. However, a memory cell can be formed by portions of two memory cell structures, e.g., where memory cell structures communicatively coupled to a same conductive line 524 are located on both sides of a conductive line 522, or a memory cell can be formed by a portion of only one memory cell structure, e.g., where memory cell structures communicatively coupled to a particular conductive line 524 are only located on one side of a conductive line 522.

FIG. 5B shows array 564 having a configuration of memory cell structures 550 where the memory cell structures 550 associated with each respective conductive line 524, and either conductive line 522 of a particular pair of conductive lines 522, are located between the particular pair of conductive lines 522. In other words, memory cell structures 550 associated with all conductive lines 524 and a pair of conductive lines 522 is located between the pair of conductive lines 522. For example, the memory cell structures 550 associated with each of conductive lines 524 and the pair of conductive lines comprising $WL_{1,j}$ and $WL_{2,j}$ are located between $WL_{1,j}$ and $WL_{2,j}$, and no memory cell structures 550 associated with either of $WL_{1,j}$ and $WL_{2,j}$ are located adjacent $WL_{1,j}$ or $WL_{2,j}$ but not between $WL_{1,j}$ and $WL_{2,j}$. That is, there are no memory cell structures 550 located between $WL_{0,j}$ and $WL_{1,j}$. The locations of memory cell structures 550 can be defined by an appropriate mask to form self-aligned vias at locations shown in FIG. 5B, e.g., self-aligned vias only along one side of each conductive line 522.

Figure 5C:
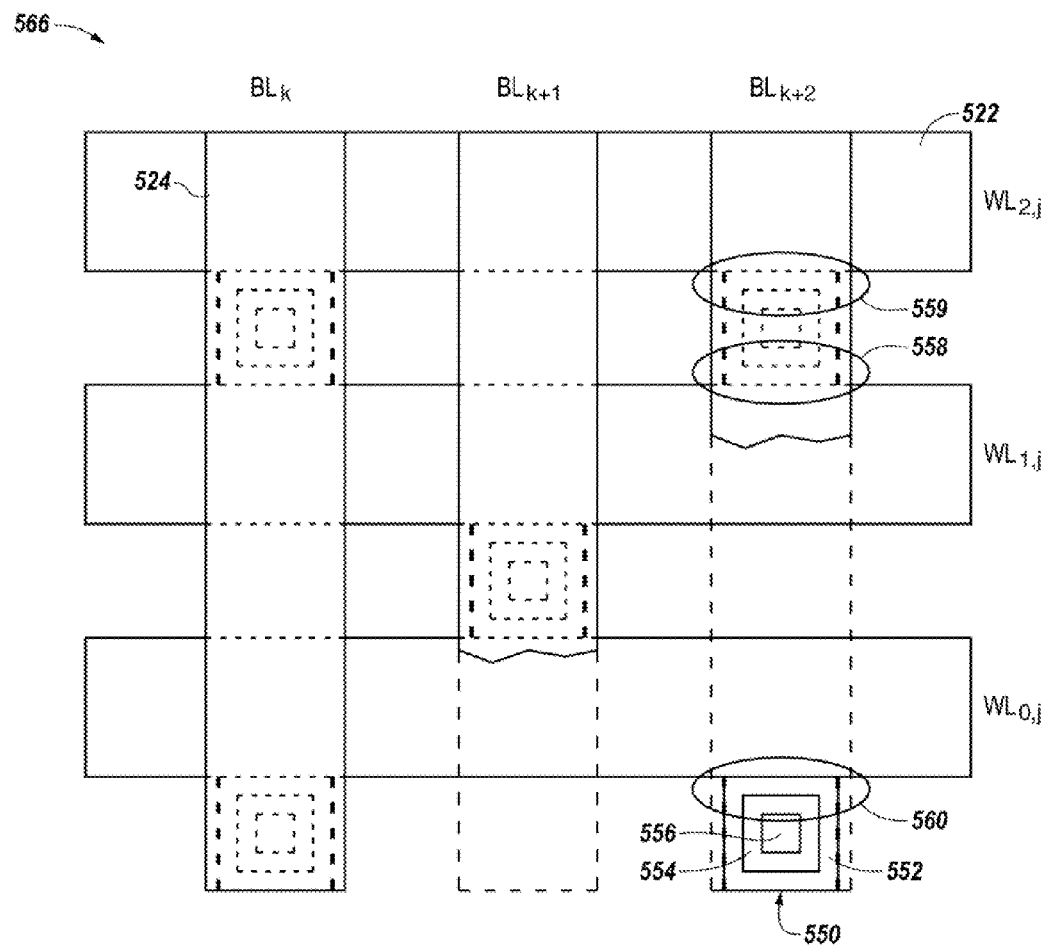
FIG. 5C illustrates location of concentric memory cell structures between different alternate pairs of conductive lines in accordance with a number of embodiments of the present disclosure.

FIG. 5C illustrates location of concentric memory cell structures between different alternate pairs of conductive lines in accordance with a number of embodiments of the present disclosure. The composition and configuration of each individual memory cell structure 550 can be the same as was described with respect to FIG. 5A, and the process for forming a particular memory cell structure 550 can be the same as described with respect to array 544 shown in FIG. 5A. However, the pattern of memory cell structure 550 locations are different in FIG. 5C than that shown in FIG. 5A. The arrangement of conductive lines 522 and 524 for array 564 can be the same as was described with respect to FIG. 5A. However, the locations of memory cell structures 550 for array 566 shown in FIG. 5C are different than that for array 544 shown in FIG. 5A (the difference being achieved by a different trench mask configuration in locating self-aligned vias), and different than that for array 564 shown in FIG. 5B.

Conductive lines 524 are formed over conductive lines 522, as shown in FIG. 5C. As such, conductive extensions 556 extend vertically down from conductive lines 524 to pass in proximity to, e.g., between, conductive lines 522, similar to the configuration shown in perspective view with respect to FIG. 3.

FIG. 5C shows concentric memory cell structures 550 being located so as to have two conductive lines 522 between concentric memory cell structures 550 along a conductive line 524, with the concentric memory cell structures 550 location being offset by one conductive line 524 for concentric memory cell structures 550 located along adjacent conductive lines 524. That is, the concentric memory cell structures 550 are located in a "checkerboard" pattern to have concentric memory cell structures 550 located at every other position along a conductive line 524 between conductive lines 522, as shown in FIG. 5C Each self-aligned via is in contact with two adjacent conductive lines 522. However, each conductive line 522 is in contact with only one self-aligned via (corresponding to a particular conductive line 524). As such, one active region, e.g., 558, 560, of one memory cell structure 550 is associated with each overlap of a conductive line 522 and a conductive line 524. Therefore, each memory cell comprises one active region 558/560 of one memory cell structure 550, involving approximately one-half the active volume per memory cell than that described with respect to FIG. 5A.

For example, one example memory cell located between $WL_{1,j}$ and $BL_{k+2}$ is shown in FIG. 5C comprising portion 558 of a first concentric memory cell structure 550. The portion 559 of the first concentric memory cell structure 550 opposite portion 558 comprises another memory cell located between $WL_{2,j}$ and $BL_{k+2}$. Another memory cell, located between $WL_{0,j}$ and $BL_{k+2}$ is shown in FIG. 5C comprising portion 560 of a second concentric memory cell structure 550.

FIG. 5C shows that there is no concentric memory cell structure 550 located between the pair of conductive lines $WL_{1,j}$ and $WL_{2,j}$ corresponding to $BL_{k+1}$. The concentric memory cell structure 550 corresponding to $WL_{1,j}$ and $BL_{k+1}$ is located between $WL_{0,j}$ and $WL_{1,j}$. The locations of memory cell structures 550 can be defined by an appropriate mask to form self-aligned vias at locations shown in FIG. 5C, e.g., self-aligned vias along a particular conductive line 524 only along one side of each conductive line 522 but offset for adjacent conductive lines 524 so as to form a "checkerboard" pattern of self-aligned vias in which to form memory cell structures 550.

Conductive lines 524 are formed over conductive lines 522, as shown in FIG. 5C. As such, conductive extensions 556 extend vertically down from conductive lines 524 to pass in proximity to, e.g., between, conductive lines 522, similar to the configuration shown with respect to FIG. 3 (as properly modified for the different pattern). Each memory cell, 558 or 559, e.g., formed of a portion of one memory cell structure 550, can be unambiguously addressed by addressing one conductive line 522, e.g., one word line, and one conductive line 524, e.g., one bit line, independent of the specific topology that may differ in the different embodiments shown in different figures.

Figure 5D:
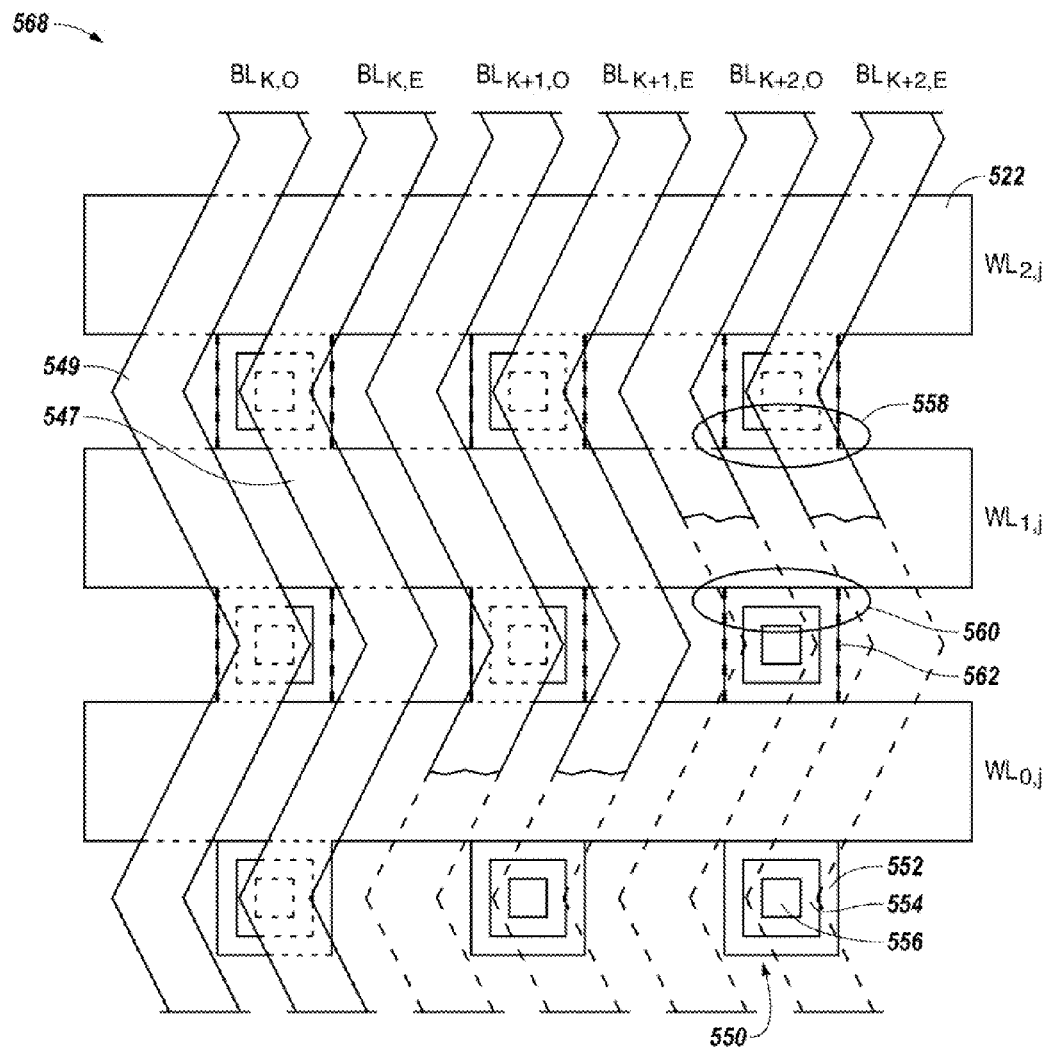
FIG. 5D illustrates location of concentric memory cell structures between pairs of conductive lines with an increased number of bit lines in the memory cell structure pitch in accordance with a number of embodiments of the present disclosure.

FIG. 5D illustrates location of concentric memory cell structures between pairs of conductive lines with an increased number of bit lines in the memory cell structure pitch in accordance with a number of embodiments of the present disclosure. The arrangement of conductive lines 522 and concentric memory cell structures 550, and the arrangement of cell select device material 552, storage element material 554, and conductive extension 556 comprising a concentric memory cell structure 550 is similar for array 568 shown in FIG. 5D to that described with respect array 544 shown in FIG. 5A. However, the quantity, configuration, and arrangement of the uppermost conductive lines, e.g., bit lines, is different for array 568 shown in FIG. 5D than that described with respect array 544 shown in FIG. 5A.

FIG. 5D shows that the bit line pitch is half that shown in FIG. 5A, resulting in a doubling of bit line density. That is, for each bit line position shown in FIG. 5A, e.g., k, k+1, k+2, there are twice as many conductive lines 547 (odd) and 549 (even) shown in FIG. 5D, e.g., indicated as odd and even bit lines associated with each position k, k+1, k+2. Array 568 includes two bit lines (at the same level) in the memory cell pitch. The conductive lines 547 and 549 have a wavy, e.g., zigzag, configuration such that each of the conductive lines 547 and 549 is configured to be in a position of contact with a conductive extension 556 of every other concentric memory cell structure 550 along a direction orthogonal to the conductive line 522 direction. That is, conductive lines 547 and 549 can be communicatively coupled to every other concentric memory cell structure 550 along a direction orthogonal, e.g., perpendicular, to the conductive line 522 direction. In a number of embodiments, the wavy configuration of conductive lines 547 and 549 is such that they contact conductive extensions 556 at locations where the direction of conductive lines 547 and 549 change, e.g., at positions along a direction substantially orthogonal to direction of conductive lines 522, in the checkerboard array of extensions. The wavy periodicity is more than one conductive line 522 pitch, such as two conductive line 522 for example.

Conductive lines 547 and 549 essentially parallel one another. While FIG. 5D shows sharp direction changes for each of conductive lines 547 and 549, embodiments of the present disclosure are not so limited, and conductive lines 547 and 549 can be formed to have smoother direction changes. Conductive lines 547 and 549 are formed over conductive lines 522, as shown in FIG. 5D. As such, conductive extensions 556 extend vertically down from conductive lines 547 and 549 to pass in proximity to, e.g., between, conductive lines 522, somewhat similar to the configuration of downward extending conductive extensions shown in perspective view with respect to FIG. 3 (ignoring different bit line quantities, configuration, and arrangement).

According to the configuration shown in FIG. 5D for array 568, the conductive extension 556 of the two concentric memory cell structure 550 adjacent a particular conductive line 522 are independently contacted by different conductive lines 547 or 549, e.g., bit lines. Alternatively stated, a respective conductive line 547 or 549 contacts the conductive extension 556 of alternating concentric memory cell structures 550. Each memory cell, 558 or 560, can be unambiguously addressed by addressing one conductive line 522, e.g., one word line, and one conductive line 547 or 549, e.g., one bit line, independent of the specific topology that may differ in the different embodiments shown in different figures.

According to the configuration shown in FIG. 5D for array 568, only one active region of one concentric memory cell structure 550 is associated with each word line-bit line overlap, which results in a reduced volume of storage element material 554 being involved with phase changes for the configuration of array 568 shown in FIG. 5D versus the configuration of array 544 shown in FIG. 5A. FIG. 5D shows active regions 558 and 560 each corresponding to conductive line, e.g., word line, $WL_{1,j}$. However, active region 558 corresponds to conductive line, e.g., bit line, $BL_{k+2, E}$, while active region 560 corresponds to conductive line, e.g., bit line, $BL_{k+2, O}$.

Other configurations for conductive lines 547 and 549 and/or concentric memory cell structure 550 locations are possible, such as parallel straight bit lines routed along each side of a conductive extension 556, the bit lines having an extension, e.g., spur, to the conductive (vertical) extension 556 of alternating concentric memory cell structures 550. Or the location of alternating concentric memory cell structures 550 may be staggered, or otherwise offset in some manner, such that parallel straight bit lines align with the conductive (vertical) extension 556 of alternating concentric memory cell structures 550.

Figure 5E:
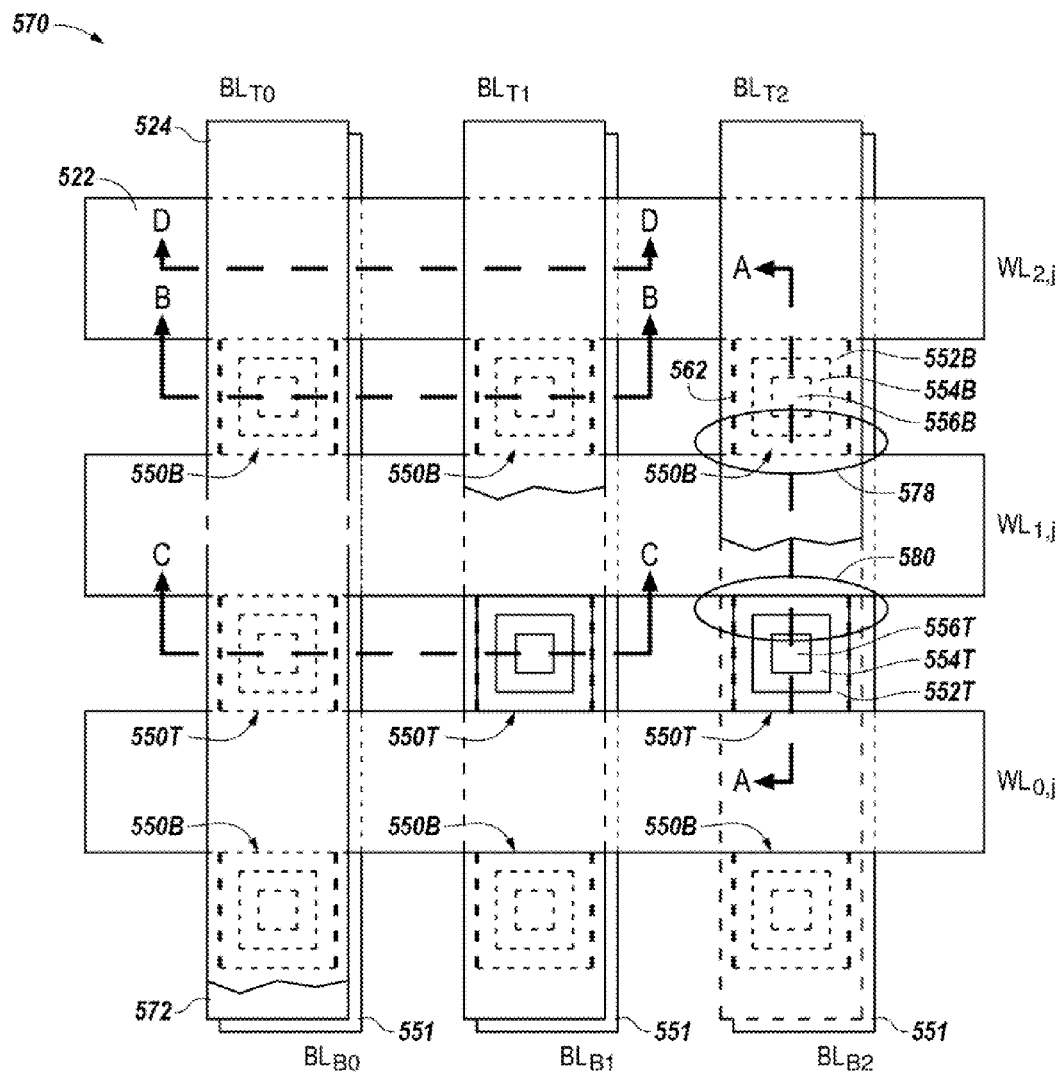
FIG. 5E illustrates location of concentric memory cell structures alternately connected above and below the array in accordance with a number of embodiments of the present disclosure.

FIG. 5E illustrates location of concentric memory cell structures alternately connected above and below the array in accordance with a number of embodiments of the present disclosure. Array 570 includes two bit lines (at the different levels, e.g., top and bottom) in the memory cell pitch. The arrangement of conductive lines 522, the locations of concentric memory cell structures with respect to the conductive lines 522, and the arrangement of cell select device material and storage element material, concentrically around a conductive extension comprising a concentric memory cell structure, is somewhat similar for array 570 shown in FIG. 5E to that described with respect array 544 shown in FIG. 5A. However, array 570 shown in FIG. 5E is different from array 544 shown in FIG. 5A in several respects related to having an additional number of bit lines formed below conductive lines 522.

Top conductive lines 524, e.g., top bit lines, are formed over conductive lines 522, and shown in FIG. 5E as $BL_{T0}$, $BL_{T1}$, and $BL_{T2}$. Bottom conductive lines 551, e.g., bottom bit lines, are formed under conductive lines 522, and shown in FIG. 5E as $BL_{B0}$, $BL_{B1}$, and $BL_{B2}$. Two different configurations of concentric memory cell structure are provided in array 570, a top-connected concentric memory cell structure 550T and a bottom-connected concentric memory cell structure 550B. The top-connected concentric memory cell structure 550T has a conductive extension 556T that extends vertically upwards and is communicatively coupled to a respective one of the top conductive lines 524. The bottom-connected concentric memory cell structure 550B has a conductive extension 556B that extends vertically downwards and is communicatively coupled to a respective one of the bottom conductive lines 551. Effectively, the conductive extension 556T extend vertically down from conductive lines 524 to pass in proximity to, e.g., between, conductive lines 522, and the conductive extension 556B extend vertically up from conductive lines 551 to pass in proximity to, e.g., between, conductive lines 522. In FIG. 5D the bit line doubling is obtained by reducing the conductive line 524 pitch, e.g., two bit lines in the cell pitch. Reducing conductive line 524 pitch can be accompanied by a cell pitch increase in the horizontal direction at any given technology node. In this case the quantity of conductive lines 524, e.g., bit lines, are also doubled on a same level. However, reducing conductive line 524 pitch can be implemented using conductive lines formed at multiple levels, e.g., some conductive lines 524 formed above the memory cell structures and some conductive lines 524 formed below the memory cell structures, which can allow for relaxed conductive line 524 pitch on a given level.

The top-connected concentric memory cell structures 550T and the bottom-connected concentric memory cell structure 550B can be formed in self-aligning vias 562, as described with respect to FIG. 5A. The top-connected concentric memory cell structure 550T includes cell select device material 552T and storage element material 554T concentrically formed around the conductive extension 556T, and the bottom-connected concentric memory cell structure 550B includes cell select device material 552B and storage element material 554B concentrically formed around the conductive extension 556B, similar to that described previously with respect to concentric memory cell structure 550. However, the configuration of the respective cell select device material and storage element material differs slightly between the top-connected concentric memory cell structure 550T and the bottom-connected concentric memory cell structure 550B related to the routing to different bit lines, e.g., top versus bottom, and which is described in further detail with respect to FIGS. 8A-8C.

FIG. 5E shows conductive lines 551, e.g., bottom bit lines, being slightly offset from conductive lines 524, e.g., top bit lines. However, the offset is merely for drawing clarity, so as to indicate the presence of top and bottom bit lines in a single top-view drawing. Conductive lines 524 and 551 can be formed in alignment with one another, e.g., conductive lines 551 are not offset from the positioning of conductive lines 524. That is, array 570 can be implemented having conductive lines 551 superimposed beneath, and vertically-aligned with, conductive lines 524.

Because the self-aligned vias 562 are formed as a trench between substantially perpendicular conductive lines 522, and the cell select device material and storage element material are deposited on the walls of the self-aligned vias 562, the cell select device material, storage element material, and conductive extension can be concentric polygon-shaped, e.g., square, rectangle, etc., volumes, as shown in FIG. 5E. According to alternative embodiments, the concentric memory cell structures can be formed in substantially circular vias in place of the self-aligned vias 562.

FIG. 5E shows alternating top-connected concentric memory cell structures 550T and bottom-connected concentric memory cell structures 550B along the bit lines, such that every other concentric memory cell structure is connected to one of the conductive line 524, e.g., top bit line, or conductive line 551, e.g., bottom bit line. That is, top-connected concentric memory cell structures 550T are adjacent one side of a particular conductive line 522 and bottom-connected concentric memory cell structures 550B are adjacent the opposite side of the particular conductive line 522, as shown in FIG. 5E.

However, embodiments of the present disclosure are not so limited, and concentric memory cell structures can also alternate between top-connected concentric memory cell structures 550T and bottom-connected concentric memory cell structures 550B for the concentric memory cell structures between a pair of conductive lines 522, e.g., in the horizontal direction of FIG. 5E, so that the concentric memory cell structures alternate in two directions, e.g., vertical direction and horizontal direction of FIG. 5E. Alternating in both horizontal and vertical directions in FIG. 5E still results in one side of a particular conductive line 522 being adjacent a top-connected concentric memory cell structures 550T and an opposite side of the particular conductive line 522 being adjacent a bottom-connected concentric memory cell structures 550B.

Because opposite sides of a conductive line 522 are adjacent to a concentric memory cell structure that is associated with a different one of conductive line 524, e.g., top bit line, or conductive line 551, e.g., bottom bit line, only one active region, e.g., 578, 580, of one memory cell structure, e.g., 550T or 550B, is associated with each overlap of a conductive line 522 and a conductive line 524 or 551. Therefore, each memory cell comprises one active region 578/580 of one memory cell structure, involving approximately one-half the active volume per memory cell than that described with respect to FIG. 5A.

Figure 8A:
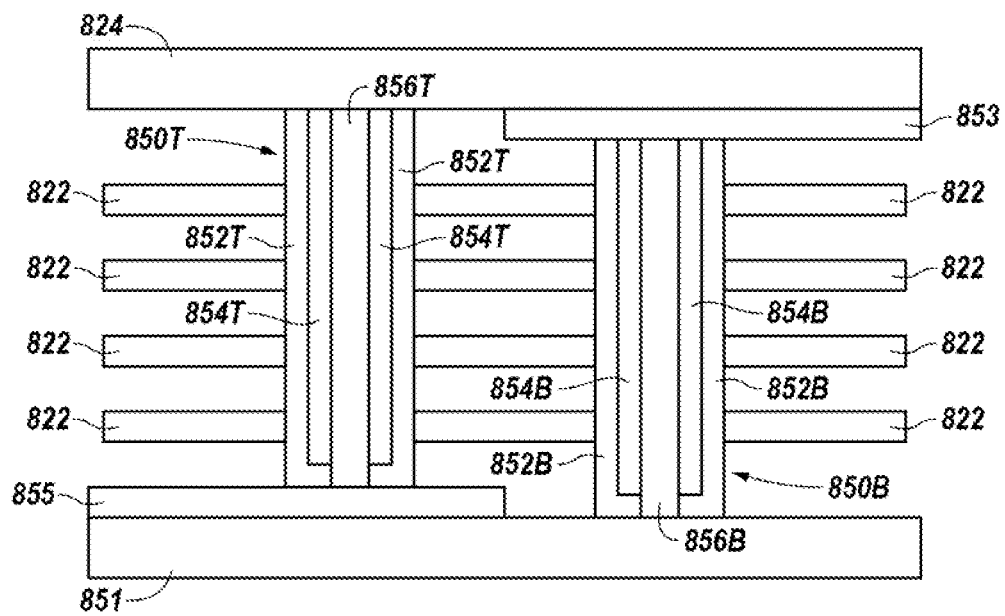
FIGS. 8A-D illustrate cross-sectional views corresponding to the three dimensional memory array of concentric memory cells shown in FIG. 5E in accordance with a number of embodiments of the present disclosure.

The cut line A-A shown in FIG. 5E provides a reference for the view shown in FIG. 8A. The cut line B-B shown in FIG. 5E provides a reference for the view shown in FIG. 8B. The cut line C-C shown in FIG. 5E provides a reference for the view shown in FIG. 8C. The cut line D-D shown in FIG. 5E provides a reference for the view shown in FIG. 8D.

Figure 6:
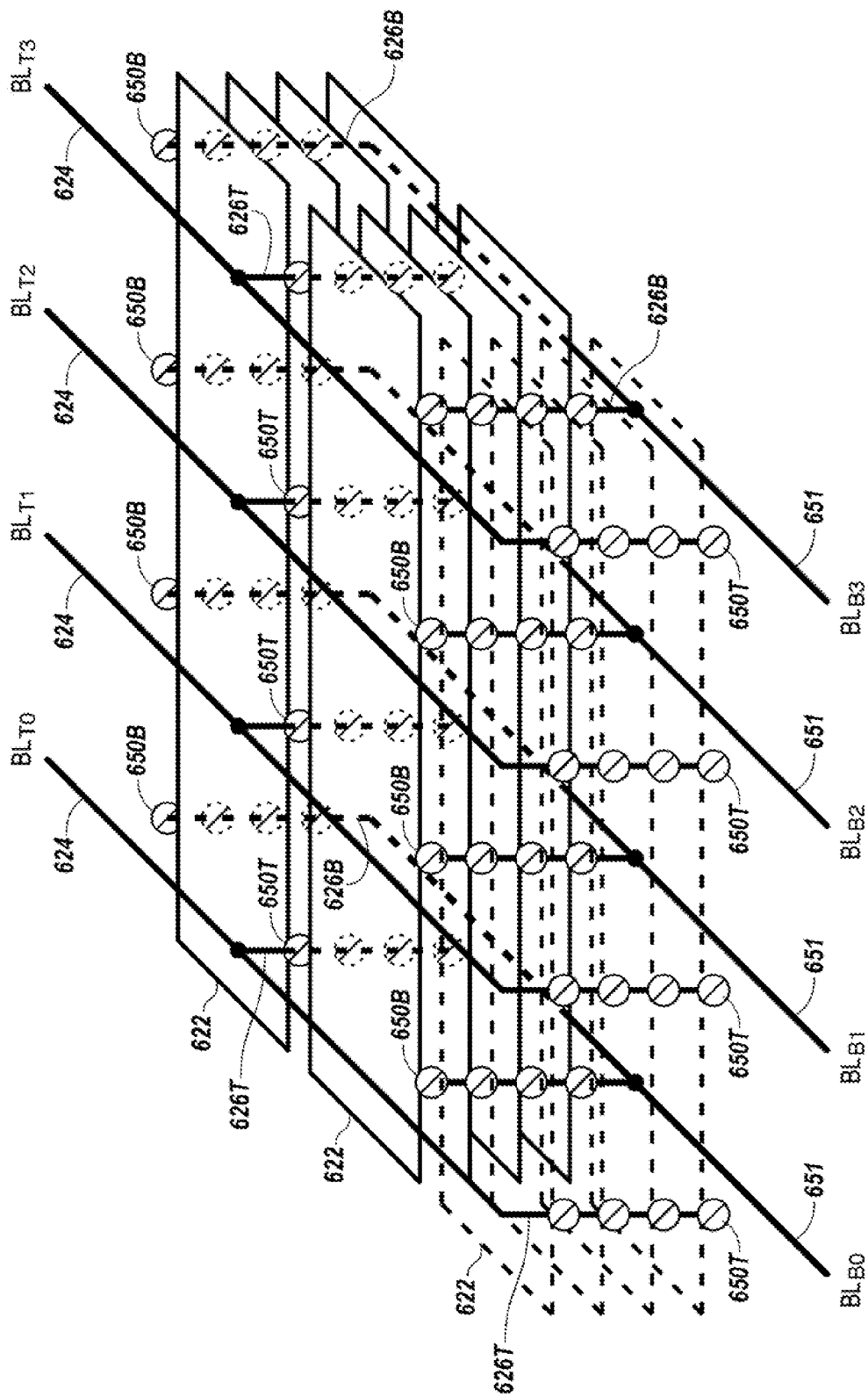
FIG. 6 illustrates a perspective view of a three dimensional memory array schematic diagram in accordance with a number of embodiments of the present disclosure.

FIG. 6 illustrates a perspective view of a three dimensional memory array schematic diagram in accordance with a number of embodiments of the present disclosure. FIG. 6 corresponds to array 570 shown in FIG. 5E (bit lines at an additional position 3 are shown in FIG. 6, and the word lines in the foreground of FIG. 6 are shown in outline for better viewing of concentric memory cell structure locations and connections). In contrast with the configuration shown in FIG. 3 having bit lines 324 formed only above the word lines 322, FIG. 6 shows top bit lines 624 formed over and bottom bit lines 651 formed under, the word lines 622. It is noted that, despite the topological disposition of bit lines above and below the word lines, and correspondingly the conductive extensions communicatively coupled to some memory cells from above and others from below, from the electrical point of view the arrangement of memory cells in the array of FIG. 3 and the array of FIG. 6 are equivalent one to the other, in that a memory cell is always placed at the proximal crossing of a word line and a bit line. Each memory cell can be unambiguously addressed by addressing one bit line, e.g., one bit line above for some memory cells or one bit line below for other memory cells, and one word line with the other bit lines and word lines being unaddressed lines.

Conductive extensions 626T extend down from top bit lines 624 to top-connected concentric memory cell structures 650T on one side of each word line 622, e.g., a back side as shown in FIG. 6. Conductive extensions 626B extend up from bottom bit lines 651 to bottom-connected concentric memory cell structures 650B on another side of each word line 622, e.g., a front side opposite the top-connected concentric memory cell structures 650T as shown in FIG. 6.

Figure 7:
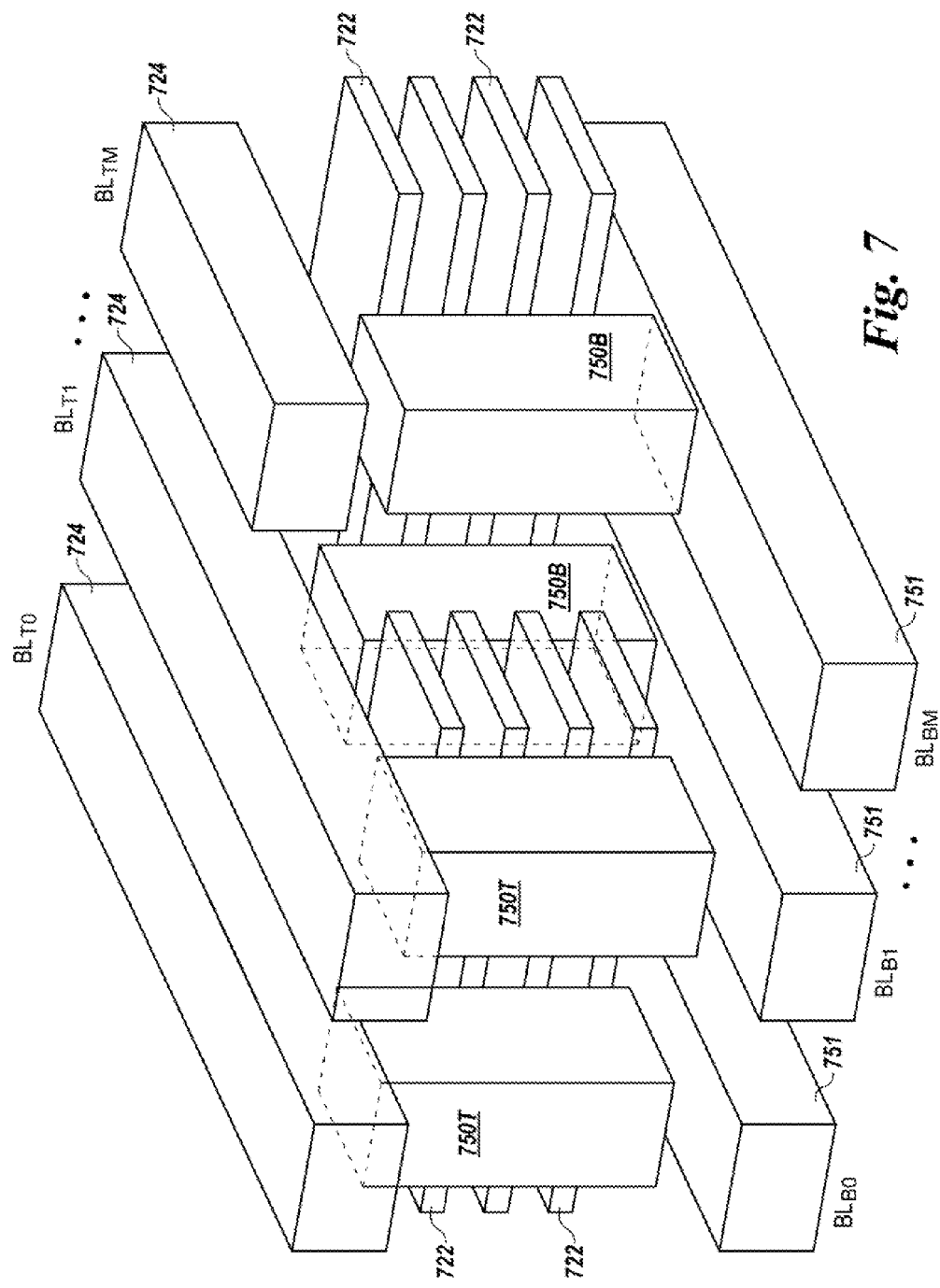
FIG. 7 illustrates a perspective view of a three dimensional memory array having bit lines above and below word lines in accordance with a number of embodiments of the present disclosure.

FIG. 7 illustrates a perspective view of a three dimensional memory array having bit lines above and below word lines in accordance with a number of embodiments of the present disclosure. FIG. 7 corresponds to array 570 shown in FIG. 5E and the three dimensional memory array schematic diagram shown in FIG. 6. Some portions of the features shown in FIG. 7 are truncated in order to view other features, for example, to see features that would otherwise be behind other features.

FIG. 7 shows top bit lines 724 formed over the word lines 722, and bottom bit lines 751 formed under the word lines 722. Top-connected concentric memory cell structures 750T, which include a conductive extension (not individually shown), extend down from top bit lines 724 and do not extend down to reach a corresponding bottom bit line 751. Bottom-connected concentric memory cell structures 750B, which include a conductive extension (not individually shown), extend up from bottom bit lines 751, and do not extend far enough up to reach a corresponding top bit line 724. FIG. 7 further shows a top-connected concentric memory cell structures 750T on one side of each word line 722, and a bottom-connected concentric memory cell structures 750B on an opposite side of each word line 722.

FIGS. 8A-D illustrate cross-sectional views corresponding to the three dimensional memory array of concentric memory cells shown in FIG. 5E in accordance with a number of embodiments of the present disclosure. The view shown in FIG. 8A corresponds to along cut line A-A shown in FIG. 5E, which is in the bit line direction. FIG. 8A shows a bottom bit line 851, which can be formed over a substrate (not shown), for example. FIG. 8A also shows a stack including a number of word lines 822 formed over the bottom bit line 851, and a top bit line 824 formed over the word lines 822. FIG. 8A shows an end view of the word lines 822, as they extend into, and out of, the page. Insulation material between individual word lines 822, and/or between word lines 822 and top 824 and/or bottom 851 bit lines is not shown in FIG. 8A for simplicity and clarity of other features.

FIG. 8A further shows cross-sections of a top-connected concentric memory cell structure 850T on the left, and a bottom-connected concentric memory cell structures 850B on the right. The top-connected concentric memory cell structure 850T includes a conductive extension 856T extending up to, and communicatively coupled with, the top bit line 824. A bottom stopping material 855 can be formed over the bottom bit line 851 at least beneath the top-connected concentric memory cell structure 850T such that the conductive extension 856T does not extend to, and is not communicatively coupled with, the bottom bit line 851.

The bottom-connected concentric memory cell structure 850B includes a conductive extension 856B extending down to, and communicatively coupled with, the bottom bit line 851. A top stopping material 853 can be formed over the bottom-connected concentric memory cell structure 850B, e.g., between the bottom-connected concentric memory cell structure 850B and the top bit line 824, at least over the bottom-connected concentric memory cell structure 850B such that the conductive extension 856B does not extend up to, and is not communicatively coupled with, the top bit line 824.

The top-connected concentric memory cell structures 850T and bottom-connected concentric memory cell structure 850B can be formed, for example, in a self-aligned via, such as was described with respect to via 562 in FIG. 5A, or other-shaped cavities as previously described. FIG. 8A shows storage element material 854T formed concentrically around the conductive extension 856T, and cell select device material 852T concentrically formed around the storage element material 854T. Some storage element material 854T and/or cell select device material 852T may form at the bottom of the self-aligned via in which the concentric memory cell structure 850T is formed, as shown in FIG. 8A. Although, FIG. 8A shows the conductive extension 856T extending down to the bottom stopping material 855, embodiments are not so limited and conductive extension 856T need not extend through the storage element material 854T and/or cell select device material 852T all the way to the bottom stopping material 855. It is sufficient for conductive extension 856T to extend at least adjacent to the word line 822. In some embodiments, storage element material 854T and memory cell select device material 852T are formed between conductive extension 856T and word lines 822 so that memory cells are substantially co-planar with word lines 822.

FIG. 8A shows storage element material 854B formed concentrically around the conductive extension 856B, and cell select device material 852B concentrically formed around the storage element material 854B. Some storage element material 854B and/or cell select device material 852B may form at the bottom of the self-aligned via in which the concentric memory cell structure 850B is formed, as shown in FIG. 8A. For the concentric memory cell structure 850B, the conductive extension 856B is formed to extend down to the bottom bit line 851, e.g., through any storage element material 854B and/or cell select device material 852B that may form at the bottom of the self-aligned via. Top stopping material 853 may be formed above the concentric memory cell structure 850B to isolate the concentric memory cell structure 850B, including at least conductive extension 856B, from the top bit line 824.

Figure 8B:
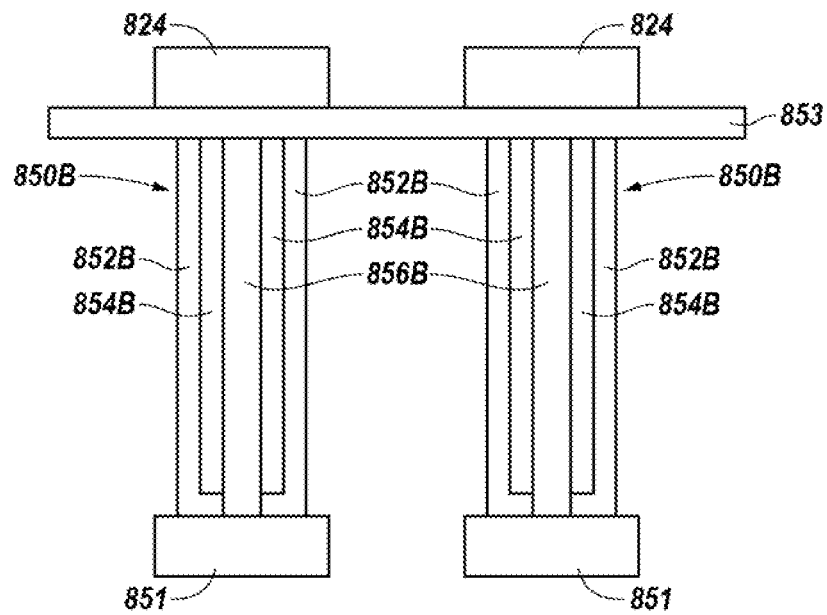

The view shown in FIG. 8B corresponds to along cut line B-B shown in FIG. 5E. FIG. 8B shows cross sections of two bottom-connected concentric memory cell structures 850B as previously described with respect to FIG. 8A. The cross section is taken between word lines, e.g., 522 shown in FIG. 5E, so word lines cross sections do not appear in FIG. 5B. FIG. 8B shows end views of top bit lines 824 and bottom bit lines 851, as they extend into, and out of, the page for this cross section. The top stopping material 853 is shown extending across the top of each bottom-connected concentric memory cell structure 850B.

Figure 8C:
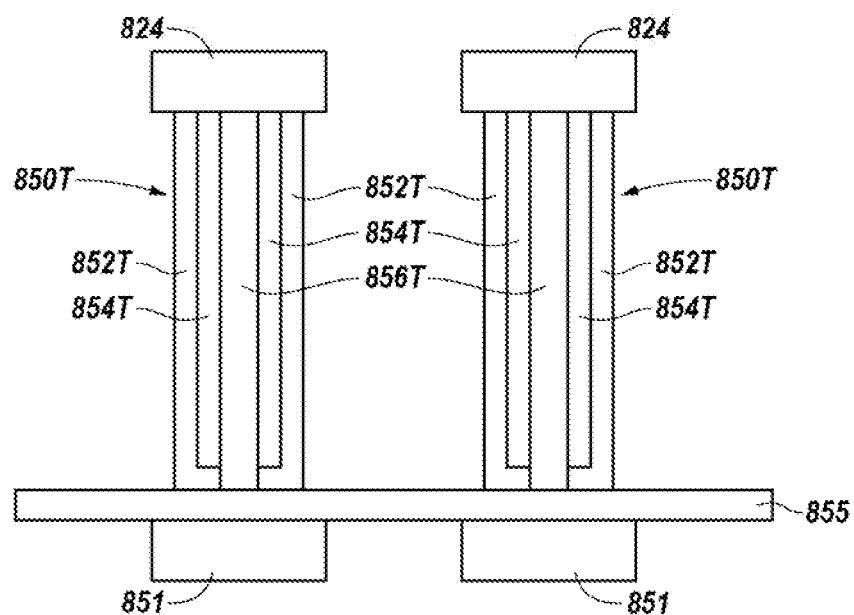

The view shown in FIG. 8C corresponds to along cut line C-C shown in FIG. 5E. FIG. 8C shows cross sections of two top-connected concentric memory cell structures 850T as previously described with respect to FIG. 8A. The cross section is taken between word lines, e.g., 522 shown in FIG. 5E, so word lines cross sections do not appear in FIG. 8C. FIG. 8C shows end views of top bit lines 824 and bottom bit lines 851, as they extend into, and out of, the page for this cross section. The bottom stopping material 855 is shown extending across the bottom of each top-connected concentric memory cell structure 850T.

Figure 8D:
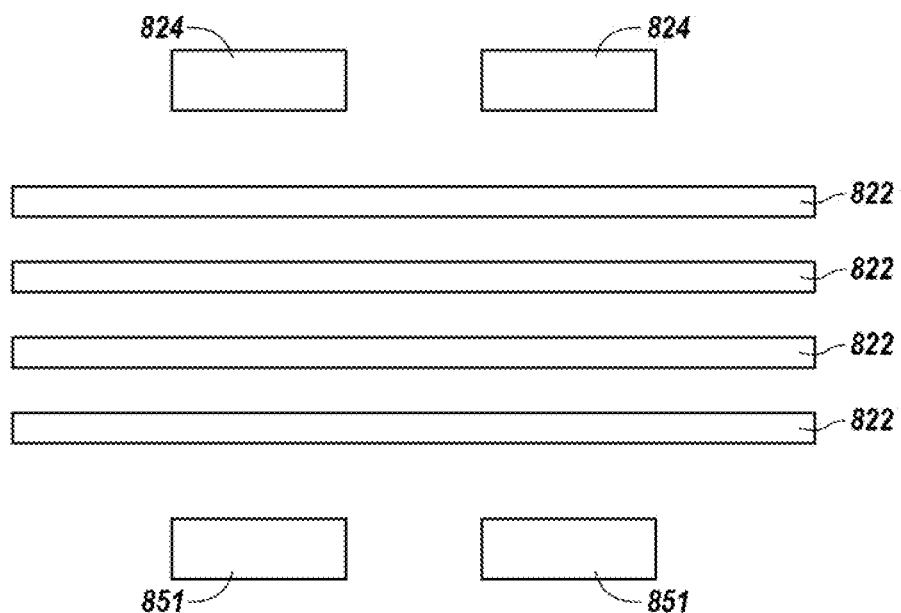

The view shown in FIG. 8D corresponds to along cut line D-D shown in FIG. 5E. The cross section is taken along word lines, e.g., 522 shown in FIG. 5E, so word lines cross sections appear in FIG. 8D, along with end views of top bit lines 824 and bottom bit lines 851, which extend into, and out of, the page for this cross section. No concentric memory cell structures are shown in FIG. 8D since they are formed between word lines 822. Other materials than those shown in FIGS. 8A-8D may be formed, e.g., as adhesion layers, or layers to avoid or minimize compositional intermix of materials such as the storage element material and the cell select device material. Moreover, with reference to FIGS. 8B-8D, exact positioning and dimensions of bottom bit lines 851 and top bit lines 824 may differ, e.g., the conductive lines may have different width/space and/or be not exactly aligned, provided they are coupled to conductive extensions 856B and 856T of respective concentric memory cell structures 850B and 850T.

The process flow for forming the structures of the present disclosure can be ascertained from these cross-sectional views, for example by appropriate masking and forming various materials over one another as shown in FIGS. 8A-8D, among others. For example, bottom bit lines 851 can be formed over a substrate, and the bottom stopping material 855 can be deposited and patterned over portions of the bottom bit lines 851, e.g., corresponding to locations at which a top-connected concentric memory cell structure 850T is to be subsequently formed. A stack of a number of alternating conductive material, e.g., metal, and insulating material can be formed over the bottom bit lines 851 and/or bottom stopping material 855, which can be patterned to separate individual word lines at a particular level. Insulating material can be deposited between the resulting stacks of word lines and insulating material can be chemical mechanically polished (CMP). Vias can be formed between the word lines. Storage element material and cell select device material can be deposited into the vias, and etched back to open the bottom of the via where a connection to a bottom bit line 851 is to be made. The via can be filled with a conductive material to form the conductive extensions, to form conductive extensions. Insulation material can be formed over a planarized surface and it can be patterned in the word line direction, for example, to leave exposed only on alternate self-aligned vias in the bit line direction while insulating remaining self-aligned vias.

Figure 9:
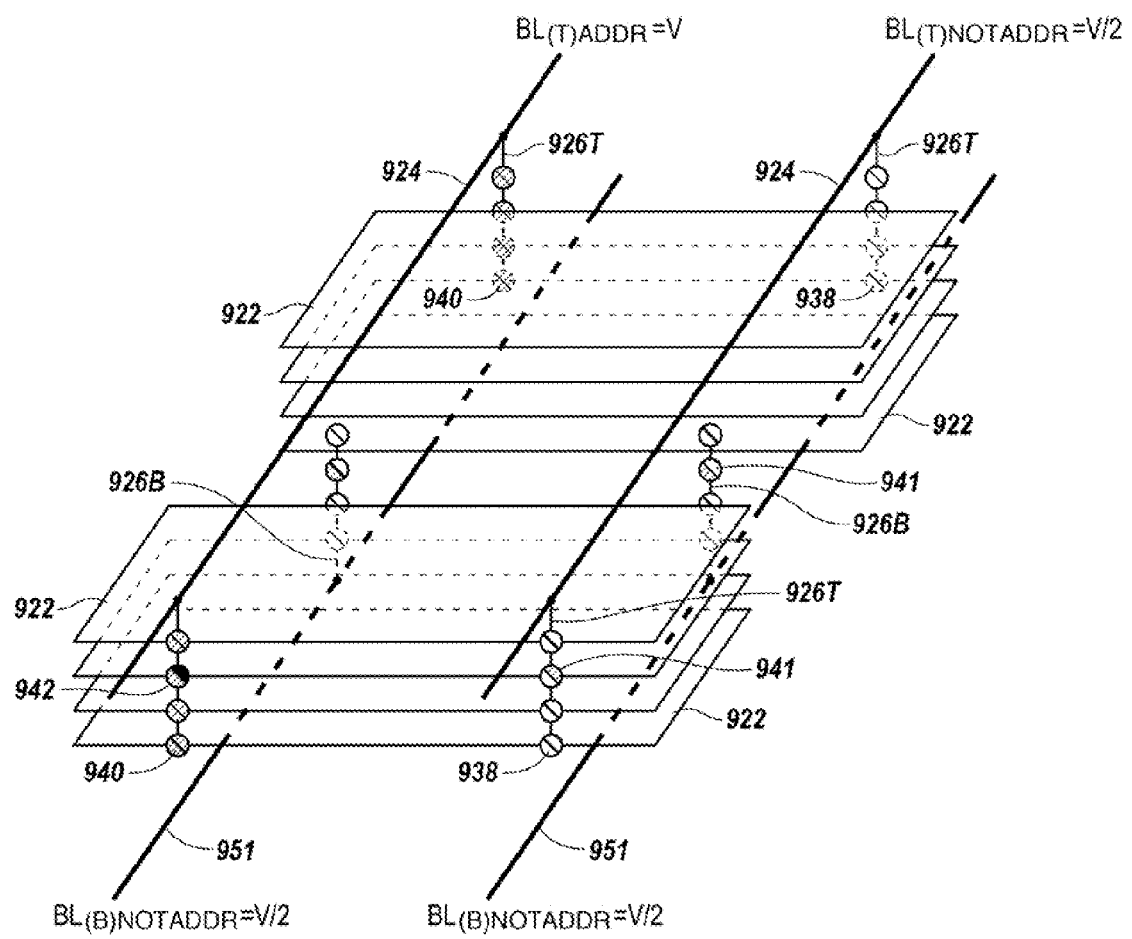
FIG. 9 illustrates a method for biasing of a three dimensional memory array having concentric memory cell structures alternately connected above and below the array in accordance with a number of embodiments of the present disclosure.

FIG. 9 illustrates a method for biasing of a three dimensional memory array having concentric memory cell structures alternately connected above and below the array in accordance with a number of embodiments of the present disclosure. FIG. 9 shows a portion of a memory array, such as that shown and described with respect to FIGS. 5E-8D. The memory array can include a plurality of word lines 922, orthogonally-oriented top bit lines 924 and bottom bit lines 951, with conductive extensions 926T communicatively coupled to the top bit lines 924 and top-connected concentric memory cell structures, and bottom-connected conductive extensions 926B communicatively coupled to the bottom bit lines 951 and bottom-connected concentric memory cell structures.

To access, e.g., program or read, a particular memory cell, a balanced biasing scheme is adopted. The addressed word line 922 at the addressed position on the addressed level, e.g., the second word line from the top in the foreground stack of word lines shown in FIG. 9, and the addressed bit line, e.g., top-left bit line shown in FIG. 9, are biased so that the voltage difference across them exceeds the threshold voltage of the respective cell select device. Unaddressed word lines 922 and unaddressed bit lines 924 and 951 are biased so that the voltage difference across any other pair of addressed and/or unaddressed word lines 922 and bit lines 924 and 951, does not exceed the threshold voltage of the respective cell select device.

For example, all other word lines 922 (including different word lines 922 located in a same level as the addressed word line 922, and word lines 922 located at different levels) and other bit lines 924 and 951 (including bit lines on the opposite side of the word line stack from the addressed bit line, and bit lines in different positions on the same side of the word line stack as the addressed bit line) can be biased at an intermediate voltage, e.g., a reference voltage ($V_{REF}$) such as a midpoint voltage between addressed bit line and word line voltages.

The addressed top bit line 924 is shown in FIG. 9 as $BL_{(T)ADDR}$ having a bias voltage V, and all other top bit lines 924 are unaddressed and shown in FIG. 9 as $BL_{(T)NOTADDR}$ having a bias voltage V/2. All other bottom bit lines 951 are unaddressed and shown in FIG. 9 as $BL_{(B)NOTADDR}$, also biased to the intermediate voltage, V/2. Likewise, the addressed word line 922, e.g., second from top in foreground stack of word lines shown in FIG. 9, is biased at a null, e.g., ground, voltage, and unaddressed word line 922, including other word lines in the foreground stack of word lines and all word lines in the background stack of word lines shown in FIG. 9, are biased to the intermediate voltage, V/2. That is, the voltage between an addressed bit line and an addressed word line is V. Unaddressed bit lines and word lines can each be biased at the inhibit voltage of V/2, such that the voltage between unaddressed bit lines and word lines is 0.

According to a number of embodiments, the unaddressed word lines 922 and unaddressed bit lines 924 and 951 can be biased to an intermediate voltage to reduce the maximum voltage drop with respect to either the addressed word line 922 or the addressed bit line 924 or 951. For example, the intermediate voltage can be chosen to be at a mid-point between the unaddressed word lines 922 and unaddressed bit lines 924 and 951. However, the intermediate voltage can be selected to be different than a mid-point voltage to minimize the disturb on the memory cells. FIG. 9 shows memory cell 942 between the addressed word line 922 and the addressed bit line 924 fully shaded to indicate the voltage difference across, V, memory cell 942 exceeding the threshold voltage of the associated cell select device.

FIG. 9 shows undisturbed memory cells 938 between unaddressed word lines 922 and unaddressed bit lines 924/951 without any shading to indicate the voltage difference across memory cell 938 is insignificant, e.g., null, zero. FIG. 9 also shows disturbed memory cells 940 between unaddressed word lines 922 and the addressed bit line 924, e.g., $BL_{(T)ADDR}$, and disturbed memory cells 941 between the addressed word line 922 and unaddressed bit lines 924 and 951, as being partially shaded to indicate the voltage difference is some intermediate voltage that is less than the threshold voltage of the respective cell select device, e.g., V/2. It can be beneficial to bias unaddressed word lines 922 and unaddressed bit lines 924 and 951 to a same voltage.

Accessing a memory cell in the memory array configuration shown and described with respect to FIG. 5E-9 involves passing current (which also flows in the addressed bit line 924 and/or addressed word line 922) through the memory cell, e.g., a resistance variable memory cell. The balanced biasing scheme of the present disclosure allows a voltage drop above threshold to be obtained only on an addressed cell, e.g., on addressed word line and bit line, while only disturbing cells along the addressed word line and addressed bit line, at not-addressed bit lines (top and bottom) and word lines, respectively, e.g., at most a minimum leakage current flows through the not addressed cells. Despite of the topological differences between the array configuration described with respect to FIG. 9 and that described with respect to FIG. 4, the biasing schemes are equivalent from the electrical point of view. In fact in both cases each memory cell can be unambiguously addressed by addressing one word line and one bit line at a voltage above threshold, while maintaining the voltage drop between unaddressed word lines and unaddressed bit lines below a threshold, e.g., 0 volts.

Figure 10A:
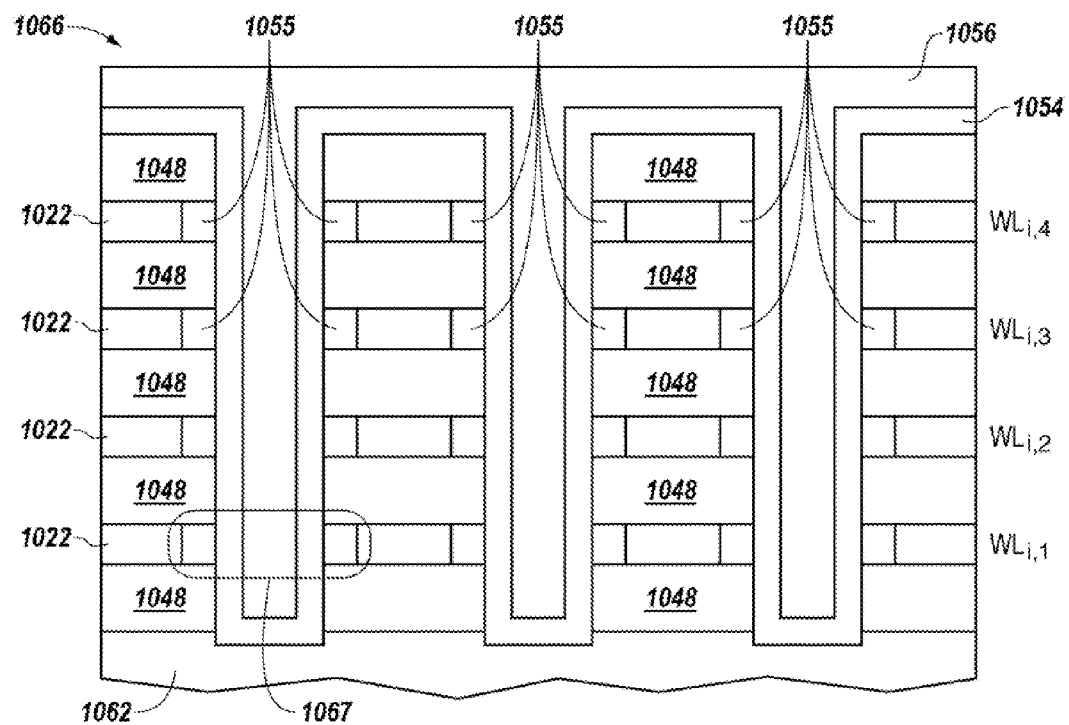
FIG. 10A illustrates a three dimensional memory array of concentric memory cells with separated switching devices in accordance with a number of embodiments of the present disclosure.

FIG. 10A illustrates a three dimensional memory array of concentric memory cells with separated switching devices in accordance with a number of embodiments of the present disclosure. According to some embodiments, the cell select device material 552 shown in FIG. 5A-5E deposited at the outermost radial position of the concentric memory cell, can be contiguous vertically between different levels of first conductive lines 522, as shown in cross-section in FIG. 8A. However, according to a number of other embodiments, the cell select device material can be separated as between the memory cells formed at different levels.

FIG. 10A shows deposit of a number of alternating insulating materials 1048, e.g., dielectric, and conductive materials 1022 over a etch stop material 1062. Vias, e.g., holes, can be etched through the alternating insulating materials 1048 and conductive materials 1022, for example stopping at the etch stop material 1062. During and/or after via formation the conductive materials 1022 can be recessed to result in the configuration illustrated in FIG. 10A. Recesses in the conductive materials 1022 with respect to the walls of the initially-formed vias can be formed with a selective etch such as non-directional etch, e.g., wet etch. Cell select device material 1055 can be deposited into the via, onto the sidewalls thereof, which can fill the areas left by the recessed conductive materials 1022 that extends from the edges of the conductive materials 1022.

The cell select device material 1055 can be removed from all but the recesses, e.g., removed from the sidewalls of the via, such as by a directional etch, e.g., dry etch, which can leave the cell select device material 1055 only in the discrete recesses. Thereafter, storage element material 1054, e.g., PCM, and conductive extension 1056, e.g., metallic vertical bit line extension, material can be formed in the via as shown. In this manner the cell select device material 1055 and the storage element material 1054 can be formed proximal the conductive materials 1022 and the conductive extension material 1056, with the cell select device material 1055 being adjacent the conductive materials 1022 and the storage element material 1054 being adjacent the conductive extension material 1056.

According to the configuration illustrated with respect to FIG. 10A, the cell select device material 1055 is formed only as a plurality of discrete structures between the conductive extension 1056 of the second conductive lines and storage element material 1054 at the crossing of the first conductive lines, thereby reducing electrical leakage and interference between vertically adjacent concentric memory cells. The storage element material 1054 and conductive extension 1056 material can be further processed, and second conductive lines, e.g., bit lines, formed thereover. The resulting structure includes the conductive extension 1056, e.g., oriented vertically, with the storage element material 1054 around the conductive extension 1056 and the cell select device material 1055 around the vertical extension at least in the direction of the conductive materials 1022. In this context, "around" is intended to mean at least partially around, e.g., at least in the direction of the conductive materials 1022.

Figure 10B:
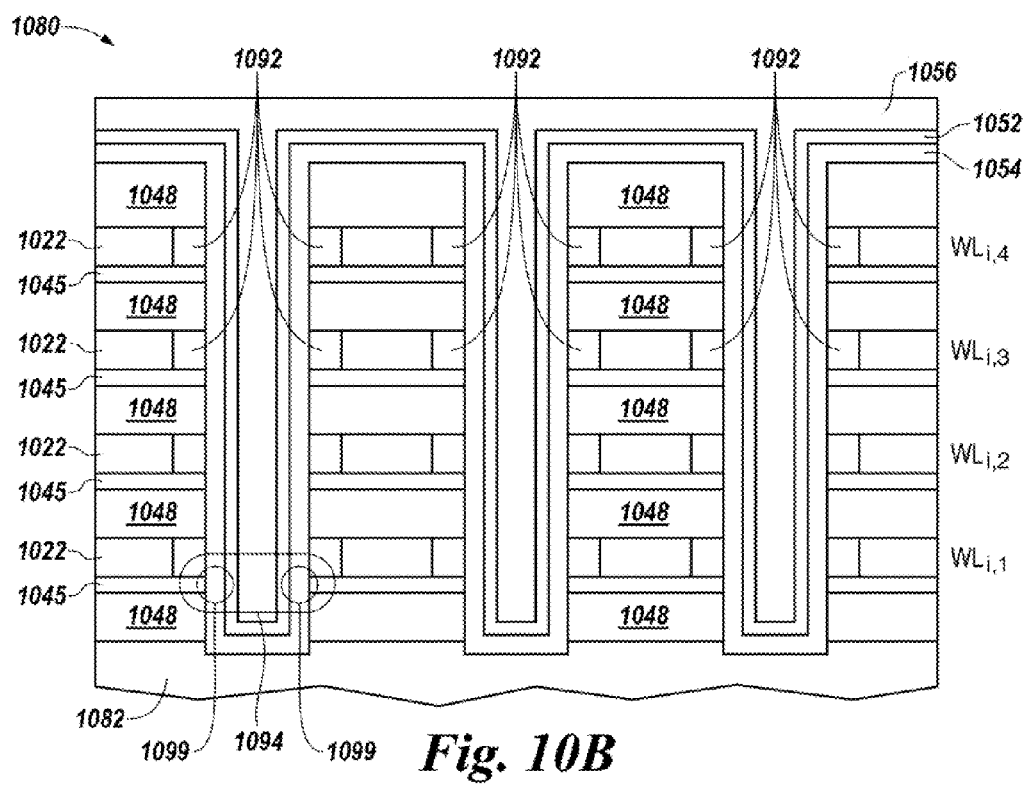
FIGS. 10B-C illustrate a three dimensional memory array of concentric memory cells having heater material with separated switching devices in accordance with a number of embodiments of the present disclosure.
Figure 10C:
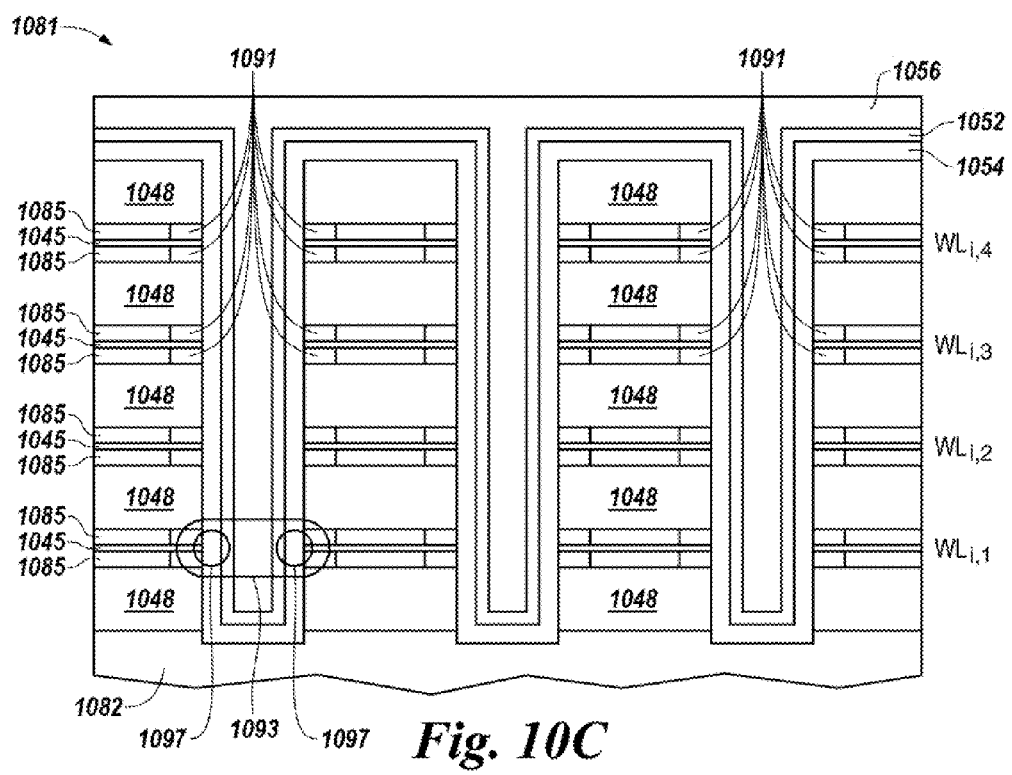

FIGS. 10B-C illustrate a three dimensional memory array of concentric memory cells having heater material in accordance with a number of embodiments of the present disclosure. The embodiments described above, for example those illustrated with respect to FIG. 5A-5E, can be implemented with the memory cell(s) comprising an additional heater material adjacent the storage element material. The use of heater material can effectively reduce first conductive line, e.g., word line, thickness in the vicinity of the storage element material, thereby involving a smaller active volume in phase changes, and can also increase current density in the heater material, which as a result can heat-up due to the Joule effect, and also transfers energy to the storage element material, which can also raise the temperature. As such, the heater material is referred to as a heater material since it may act as a heater. Also, other materials may be formed, e.g., deposited, before, after, and/or between cell device select material, storage element material, and/or conductive extension material, for example to form adhesion layers or barriers against interdifussion of materials.

The formation process shown and described with respect to FIG. 10B is somewhat similar to that shown and described with respect to FIG. 10A in that a stack of alternating insulating materials 1048, e.g., dielectric, and conductive materials 1022 over a etch stop material 1082. However, included in the stack is heater material 1045 formed in electrical contact with conductive material 1022, e.g., over the insulating materials 1048. Vias can be etched through the alternating insulating materials 1048, heater materials 1045, and conductive materials 1022, for example stopping at the etch stop material 1082.

During and/or after via formation the conductive materials 1022 can be recessed such that the heater material 1045 protrudes beyond an edge of the conductive material 1022. The volume adjacent the conductive materials 1022, e.g., where recessed, can be filled with insulating material 1092 (in a similar manner to that described with respect to FIG. 10A for filling the recesses with cell select material) to result in the configuration illustrated in FIG. 10B, e.g., insulating material 1092 can be deposited into the via, including onto the sidewalls thereof, filling the recesses, so as to extend from the edges of the conductive materials 1022, and then etched back so that the insulating material only occupies the recesses, that is leaving an exposed surface of the heater material at the sidewalls of vias.

According to a number of alternative embodiments, rather than form recesses in the conductive materials 1022, depositing insulating material 1092 and etching to remove all but the insulating material 1092 in the recesses, the conductive materials 1022 can be selectively oxidized (with or without forming the recesses) to form insulating material 1092 shown in FIG. 10B.

The vias can be filled by subsequently forming, e.g., depositing, a storage element material 1054, e.g., phase change material (PCM), a cell select device material 1052, e.g., ovonic threshold switch (OTS) material, and a conductive extension material 1056, e.g., metallic material, such that the result is the cell select device material 1052 and storage element material 1054 are proximal the conductive extension material 1056. For instance, the cell select device material 1052 and storage element material 1054 can be formed around the conductive extension material 1056, e.g., concentric around the conductive extension material 1056 within the via at least in the direction of the conductive materials 1022 such as being concentric thereto. The storage element material 1054 can be adjacent the heater material 1045. In this context, "around" is intended to mean at least partially around, e.g., at least in the direction of the conductive materials 1022.

Because the area left by recessing the first conductive line material 1022 is filled with insulating material 1092, current flowing in the first conductive lines 1022 is channeled to the heater material 1045, with a relatively smaller cross-sectional area, in the vicinity of the concentric memory cell, thereby concentrating the current toward a smaller volume of storage element material 1054 involved in phase changes, as indicated in FIG. 10B at 1099. The use of heater material 1045 effectively reduces first conductive line 1022 thickness in the vicinity of the storage element material 1054, thereby involving a smaller active volume in phase changes, and also increases current density in the heater material 1045, which heats-up due to the Joule effect, and also transfers energy to the storage element material 1054, which can also raise the temperature. As such, the heater material 1045 is so named since it may act as a heater. The cell select device material 1052, storage element material 1054, and conductive extension material 1056 can be further processed, and second conductive lines, e.g., bit lines, formed thereover, as described previously.

FIG. 10C illustrates a three dimensional memory array 1081 of concentric memory cells 1093 having conductive lines, e.g., word lines, with an interceding heater material in accordance with a number of embodiments of the present disclosure. The configuration of memory array 1081 shown in FIG. 10C can be formed by depositing a number of instances of insulating materials 1048, e.g., dielectric, conductive material 1085, heater material 1045, and conductive material 1085 over a etch stop material 1082. The two conductive materials 1085 comprise the conductive lines, e.g., word lines, which have a heater material 1045 disposed therebetween, e.g., interceding to the conductive line.

Vias can be etched through the number of instances of insulating materials 1048 and conductive lines having the interceding heater material, e.g., conductive material 1085, heater material 1045, and conductive material 1085. The conductive materials 1085 can be each recessed with a non-directional etch, e.g., wet etch, to create a recess above and below each heater material 1045. The conductive materials 1085 can be each recessed such that the heater material 1045 protrudes beyond an edge of the conductive material 1085. Alternatively, the adjacent conductive materials 1085 above and below the heater material 1045 can be selectively oxidized to form insulating material 1091 above and below each instance of heater material 1045). The heater material 1085 can be left to protrude from an edge of the conductive material 1085 between the insulating materials 1091. The non-directional etch can be specific to the conductive materials 1085 but not (or less so) the heater material 1045, which can be a different material than the conductive materials 1085.

Insulating material 1091 can be deposited into the via, including onto the sidewalls thereof, filling the areas left by the recessed conductive materials 1085 above and below the heater material 1045 that extends from the edges of the conductive materials 1085. The insulating material 1091 can be removed from the top surface, e.g., above the upper insulating material 1048, and removed from the sidewalls of the vias, such as by a directional etch, e.g., dry etch, which can leave the insulating material 1091 only in the discrete areas left by the recessed conductive materials 985, immediately above and below the heater materials 1045.

The resulting vias can be filled by subsequently forming, e.g., depositing, a storage element material 1054, e.g., phase change material (PCM), a cell select device material 1052, e.g., ovonic threshold switch (OTS) material, and a conductive extension material 1056, e.g., metallic material, such that the result is storage element material 1054 being adjacent heater material 1045. The resulting structure includes the conductive extension 1056, e.g., oriented vertically, with the storage element material 1054 around the conductive extension material 1056 and the cell select device material 1055 around the vertical extension at least in the direction of the conductive materials 1022. In this context, "around" is intended to mean at least partially around, e.g., at least in the direction of the conductive materials 1022. For example, the cell select device material 1052 and storage element material 1054 can be concentric around the conductive extension material 1056, as shown in FIG. 10C.

Although the amount of surface area between the cell select device material, e.g., OTS, and the storage element material, e.g., PCM, is decreased, a relatively large current between these two materials may be used to amorphize the entire volume of the storage element material. The active volume is about ws*tGST*tWL where ws is the strip width of the storage element material 1054 at the interface with adjacent material, e.g., at the vertical bit line intersection with the word line, tGST is the active storage element material thickness, and tWL is the effective heater material 1045 thickness. Effective conductive line thickness tWL can be reduced to a thickness of a heater material 1045, tH, while maintaining overall acceptable resistance of the conductive line.

According to some embodiments, for each deck, a layer of storage element material, e.g., PCM such as GST, can be flat-deposited so as to be communicatively coupled with the conductive line material, e.g., in direct contact with the conductive line material or sandwiched between two layers of the conductive line material similar to the heater material configuration. In a similar fashion as described with reference to FIGS. 10A and 10B, the conductive line material ends at the sidewalls of a via can be recessed and insulated, for example, by selective etch or oxidation, through the cell select device material.

According to some embodiments, a three dimension memory array can include a stack comprising a plurality of conductive lines adjacent storage element material at a number of levels separated from one another by at least an insulation material. The storage element material forms a protrusion with respect to each of the plurality of conductive lines, such as at an edge thereof. At least one conductive extension can be arranged to extend substantially perpendicular to the plurality of conductive lines and adjacent storage element material. The cell select material can be formed within the via between the storage element material protrusion and the at least one conductive extension.

This embodiment can reduce the overall cell dimensions since only two materials are in the vertical BL portion, e.g., the cell select material and the conductive extension material. This embodiment also confines the active storage element material volume of a memory cell to between the conductive line and the vertical conductive extension, reducing active storage element material volume to ws*tGST*EXTWL where ws is the strip width of the storage element material at the interface with adjacent material, e.g., at the vertical bit line intersection with the word line, tGST is the active storage element material thickness, and EXTWL is the extension of thin storage element material, e.g., GST, from the relatively thicker low-resistance conductive line material.

With respect to FIGS. 3-10C, the memory cells are formed substantially co-planar with planes of the word line stacks. That is, the cell select device material, e.g., OTS, and the storage element material, e.g., PCM, are formed in series between a first terminal (electrode), e.g., conductive extension coupled to a bit line, and a second terminal (electrode), e.g., word line.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A three dimensional memory array, comprising:
   a stack comprising a plurality of first conductive lines at a number of levels separated from one another by at least an insulation material;
   at least one conductive extension arranged to extend substantially perpendicular to the plurality of first conductive lines;
   storage element material formed around the at least one conductive extension; and
   cell select material formed around the at least one conductive extension,
   wherein the at least one conductive extension, storage element material, and cell select material are located between co-planar pairs of the plurality of first conductive lines.

2. The memory array of claim 1, wherein the at least one conductive extension, storage element material, and cell select material are located between each pair of the plurality of first conductive lines.

3. The memory array of claim 1, wherein the storage element material is concentrically formed around and adjacent to the at least one conductive extension.

4. The memory array of claim 1, wherein the cell select material is concentrically formed around and adjacent to the at least one conductive extension.

5. The memory array of claim 1, wherein the storage element material and the cell select material are formed between the at least one conductive extension and a respective one of the plurality of first conductive lines.

6. The memory array of claim 1, further comprising a plurality of second conductive lines formed to extend substantially perpendicular to the plurality of first conductive lines at a different level than the number of levels, and arranged to extend substantially perpendicular to the at least one conductive extension,
   wherein the at least one conductive extension is coupled to at least one of the plurality of second conductive lines.

7. The memory array of claim 6, wherein the at least one conductive extension, storage element material, and cell select material are located between each of the plurality of first conductive lines along each of the plurality of second conductive lines.

8. The memory array of claim 6, wherein the plurality of second conductive lines is formed over the plurality of first conductive lines and the at least one conductive extension.

9. The memory array of claim 1, wherein a plurality of second conductive lines are arranged to extend substantially perpendicular to the plurality of first conductive lines at a level above the plurality of first conductive lines.

10. The memory array of claim 1, wherein the at least one conductive extension includes a plurality of conductive extensions, and wherein a plurality of second conductive lines are arranged to be communicatively coupled to every other one of the plurality of conductive extensions in a direction substantially perpendicular to the plurality of first conductive lines.

11. The memory array of claim 10, wherein the plurality of second conductive lines in a pitch that is half a pitch of memory cell structures, the memory cell structures comprising the at least one conductive extension, storage element material, and cell select material are located between each of the plurality of first conductive lines.

12. The memory array of claim 1, wherein the at least one conductive extension includes a plurality of conductive extensions, and wherein a plurality of second conductive lines having a first quantity formed above the first conductive lines and a second quantity formed below the first conductive lines, wherein each of the plurality of second conductive lines are arranged to be communicatively coupled to every other one of the plurality of conductive extensions in a direction substantially perpendicular to the plurality of first conductive lines and the plurality of conductive extensions, a respective one of the plurality of conductive extensions being communicatively coupled to only one of the plurality of second conductive lines.

13. The memory array of claim 1, wherein the storage element material is phase change material (PCM), and the cell select material is ovonic threshold switch (OTS) material.

14. The memory array of claim 13, wherein the PCM and OTS material are at least located between the at least one conductive extension and each of the plurality of first conductive lines.

15. The memory array of claim 1, further comprising a heater material adjacent to and communicatively coupled with each of the plurality of first conductive lines, the heater material having a cross-sectional area smaller than that of at least one of the plurality of first conductive lines, the heater material arranged in series between a respective one of the plurality of first conductive lines and the storage element material.

16. The memory array of claim 1, wherein the at least one conductive extension, storage element material, and cell select material comprises a memory cell structure, and the three dimensional memory array is configured such that portions of two memory cell structures comprise a memory cell.

17. The memory array of claim 16, wherein memory cell structures are located along each side of each one of the plurality of first conductive lines.

18. A three dimensional memory array, comprising:
a stack comprising a plurality of first conductive lines at a number of levels separated from one another by at least an insulation material;
a number of memory cell structures, comprising:
at least one conductive extension arranged to extend substantially perpendicular to the plurality of first conductive lines;
storage element material formed around the at least one conductive extension; and
cell select material formed around the at least one conductive extension,
wherein the number of memory cell structures are located between every other of the plurality of first conductive lines.

19. The memory array of claim 18, wherein memory cell structures are located only along one side of a respective one of the plurality of first conductive lines.

20. The memory array of claim 18, wherein the number of memory cell structures are configured such that a portion of a memory cell structure is an active volume of the storage element material associated with a memory cell corresponding to a particular one of the plurality of first conductive lines.

21. The memory array of claim 18, wherein the storage element material is phase change material (PCM), and the cell select material is ovonic threshold switch (OTS) material.

22. The memory array of claim 18, further comprising a heater material adjacent to and communicatively coupled with each of the plurality of first conductive lines, the heater material having a cross-sectional area smaller than that of at least one of the plurality of first conductive lines, the heater material arranged in series between a respective one of the plurality of first conductive lines and the storage element material.

23. The memory array of claim 18, further comprising a plurality of second conductive lines formed over the stack, and arranged to extend substantially perpendicular to the plurality of first conductive lines, wherein the memory cell structures are located between every other pair of the plurality of first conductive lines along a particular one of the plurality of second conductive lines and between a different every other pair of the plurality of first conductive lines along each one of the plurality of second conductive lines adjacent the particular one of the plurality of second conductive lines.

24. A memory array, comprising:
a stack comprising a plurality of first conductive lines at a number of levels separated from one another by at least an insulation material;
a plurality of memory cell structures located between each of the plurality of first conductive lines, each memory cell structure comprising:
at least one conductive extension arranged to extend substantially perpendicular to the plurality of first conductive lines;
storage element material formed proximal the at least one conductive extension; and
cell select material formed proximal the at least one conductive extension;
a first plurality of second conductive lines formed over the plurality of first conductive lines and the plurality of memory cell structures;
a second plurality of second conductive lines formed under the plurality of first conductive lines and the plurality of memory cell structures,
wherein alternating ones of the plurality of memory cell structures in a direction perpendicular to the plurality of first conductive lines are coupled to the first plurality of second conductive lines and remaining alternating ones of the plurality of memory cell structures in the direction perpendicular to the plurality of first conductive lines are coupled to the second plurality of second conductive lines.

25. The memory array of claim 24, wherein the storage element material is formed at least partially around the at least one conductive extension, and the cell select material is formed around the at least one conductive extension.

26. The memory array of claim 24, wherein the storage element material and the cell select material are formed between the at least one conductive extension and a respective one of the plurality of first conductive lines.

27. The memory array of claim 24, wherein memory cell structures located along one side of a particular one of the plurality of first conductive lines are all coupled to the first plurality of second conductive lines and memory cell structures located along an opposite side of the particular one of the plurality of first conductive lines are all coupled to the second plurality of second conductive lines.

28. The memory array of claim 24, wherein the storage element material is phase change material (PCM), and the cell select material is ovonic threshold switch (OTS) material.

29. The memory array of claim 24, further comprising a heater material adjacent to and communicatively coupled with each of the plurality of first conductive lines, the heater material having a cross-sectional area smaller than that of at least one of the plurality of first conductive lines, the heater material arranged in series between a respective one of the at least one of the plurality of first conductive lines and the storage element material.

30. The memory array of claim 29, wherein the plurality of first conductive lines comprise two portions, with the heater material located adjacent to and between the two portions of each of the plurality of first conductive lines.

31. The memory array of claim 24, including a heater material formed adjacent the storage element material, the heater material communicatively coupled with a corresponding one of the plurality of first conductive lines such that the heater material protrudes from an edge of the corresponding one of the plurality of first conductive lines, and wherein the cell select material is formed between the storage element material and the at least one conductive extension.

32. The memory array of claim 31, wherein the heater material is formed from a same material as the storage element material.

* * * * *